United States Patent
Ozawa et al.

(10) Patent No.: US 11,101,275 B2
(45) Date of Patent: Aug. 24, 2021

(54) FERROELECTRIC MEMORY ARRAY SURROUNDED BY FERROELECTRIC DUMMY CAPACITORS

(71) Applicant: ROHM CO., LTD., Kyoto (JP)

(72) Inventors: Takanori Ozawa, Kyoto (JP); Izumi Yano, Kyoto (JP); Toshiyuki Shiraishi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 19 days.

(21) Appl. No.: 15/356,749

(22) Filed: Nov. 21, 2016

(65) Prior Publication Data

US 2017/0179140 A1 Jun. 22, 2017

(30) Foreign Application Priority Data

Dec. 18, 2015 (JP) .............................. JP2015-247771

(51) Int. Cl.
| | | |
|---|---|---|
| *H01L 27/11514* | (2017.01) | |
| *H01L 27/11507* | (2017.01) | |
| *H01L 49/02* | (2006.01) | |

(52) U.S. Cl.
CPC .. *H01L 27/11514* (2013.01); *H01L 27/11507* (2013.01); *H01L 28/57* (2013.01)

(58) Field of Classification Search
CPC ......... H01L 27/11502; H01L 28/11502; H01L 27/11504; H01L 28/57; H01L 27/11514; H01L 26/11507
See application file for complete search history.

(56) References Cited

U.S. PATENT DOCUMENTS

| | | | | |
|---|---|---|---|---|
| 5,307,304 A | * | 4/1994 | Saito ...................... | G11C 11/22 257/E27.085 |
| 5,635,421 A | * | 6/1997 | Ting .................... | H01L 27/0805 257/E27.048 |
| 6,320,214 B1 | * | 11/2001 | Matsuda ........... | H01L 27/11502 257/213 |
| 6,420,744 B1 | * | 7/2002 | Kim .................. | H01L 27/11502 257/295 |
| 6,838,718 B2 | * | 1/2005 | Nakamura ........ | H01L 27/11502 257/295 |
| 6,838,869 B1 | * | 1/2005 | Rogers ............... | G01R 27/2605 257/48 |
| 7,381,646 B2 | * | 6/2008 | Su ..................... | H01L 21/76808 257/E21.477 |
| 8,441,850 B2 | * | 5/2013 | Lee ........................ | G11C 5/025 365/171 |

(Continued)

FOREIGN PATENT DOCUMENTS

| | | |
|---|---|---|
| JP | 2006165126 A | 6/2006 |
| JP | 2006237836 A | 9/2006 |

(Continued)

*Primary Examiner* — Shih Tsun A Chou
(74) *Attorney, Agent, or Firm* — Rabin & Berdo, P.C.

(57) ABSTRACT

A nonvolatile logic cell (nonvolatile storage element) 21 includes ferroelectric capacitors 25 and MOSFETs 26. A plurality of ferroelectric dummy capacitors 32 and 33 are formed in a periphery of the nonvolatile logic cell 21. Each of the ferroelectric capacitors 25 and the ferroelectric dummy capacitors 32 and 33 includes a lower electrode 51, a ferroelectric film 52 formed above the lower electrode 51, and an upper electrode 53 formed above the ferroelectric film 52.

3 Claims, 38 Drawing Sheets

(56) References Cited

U.S. PATENT DOCUMENTS

| | | | |
|---|---|---|---|
| 2002/0027798 A1* | 3/2002 | Takashima | G11C 11/22 365/145 |
| 2002/0173111 A1* | 11/2002 | Kasai | H01L 27/105 438/396 |
| 2003/0204832 A1* | 10/2003 | Matumoto | G06F 17/5068 716/52 |
| 2007/0037394 A1* | 2/2007 | Su | H01L 21/76808 438/687 |
| 2008/0076192 A1* | 3/2008 | Hidaka | H01L 27/105 438/3 |
| 2008/0087928 A1* | 4/2008 | Nagai | H01L 27/105 257/295 |
| 2009/0244948 A1* | 10/2009 | Hung | G11C 5/14 365/51 |
| 2011/0010493 A1 | 1/2011 | Kimura et al. | |
| 2012/0047472 A1* | 2/2012 | Fukuda | G06F 17/5081 716/52 |
| 2012/0250392 A1* | 10/2012 | Fujimori | H01L 27/0207 365/145 |
| 2013/0020679 A1* | 1/2013 | Nagai | H01L 22/14 257/532 |
| 2014/0232007 A1* | 8/2014 | Kasai | H01L 23/60 257/773 |
| 2015/0028451 A1* | 1/2015 | Watanabe | G06F 17/5068 257/532 |
| 2015/0060969 A1* | 3/2015 | Matsuura | G11C 11/221 257/295 |
| 2016/0093627 A1* | 3/2016 | Sashida | H01L 23/585 257/532 |
| 2016/0204783 A1* | 7/2016 | Rajendra | G11C 7/1084 365/185.2 |

FOREIGN PATENT DOCUMENTS

| | | |
|---|---|---|
| JP | 2008010655 A | 1/2008 |
| JP | 2009-206942 A | 9/2009 |
| JP | 2014-103426 A | 6/2014 |
| JP | 2015056411 A | 3/2015 |

\* cited by examiner

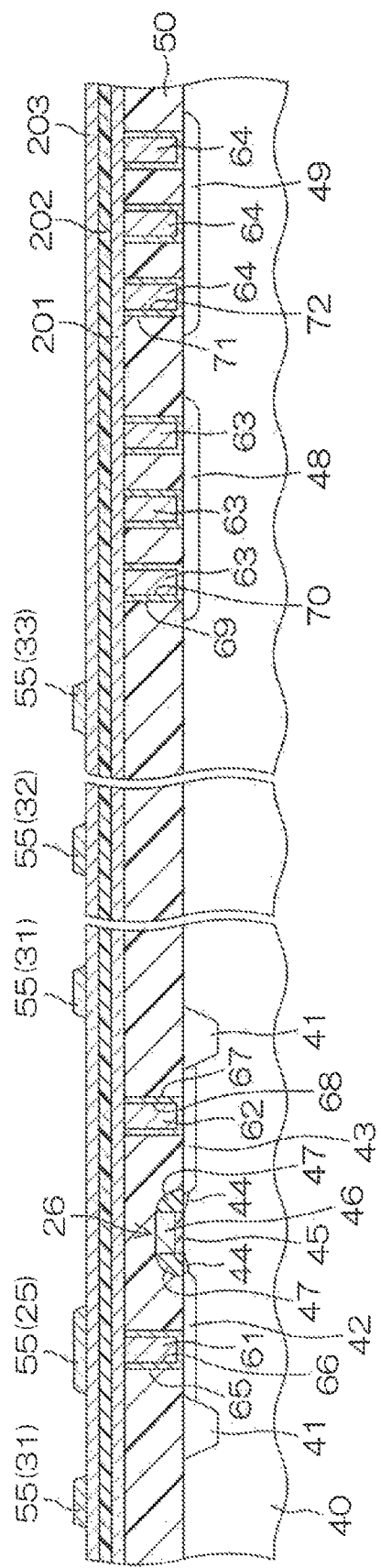

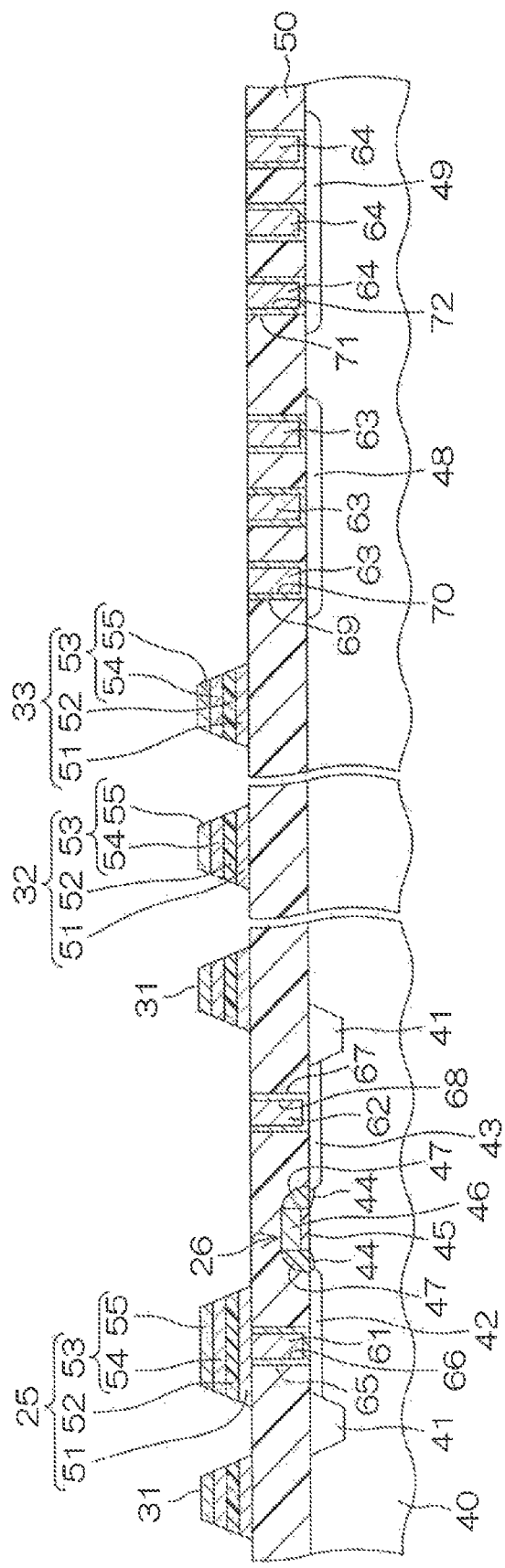

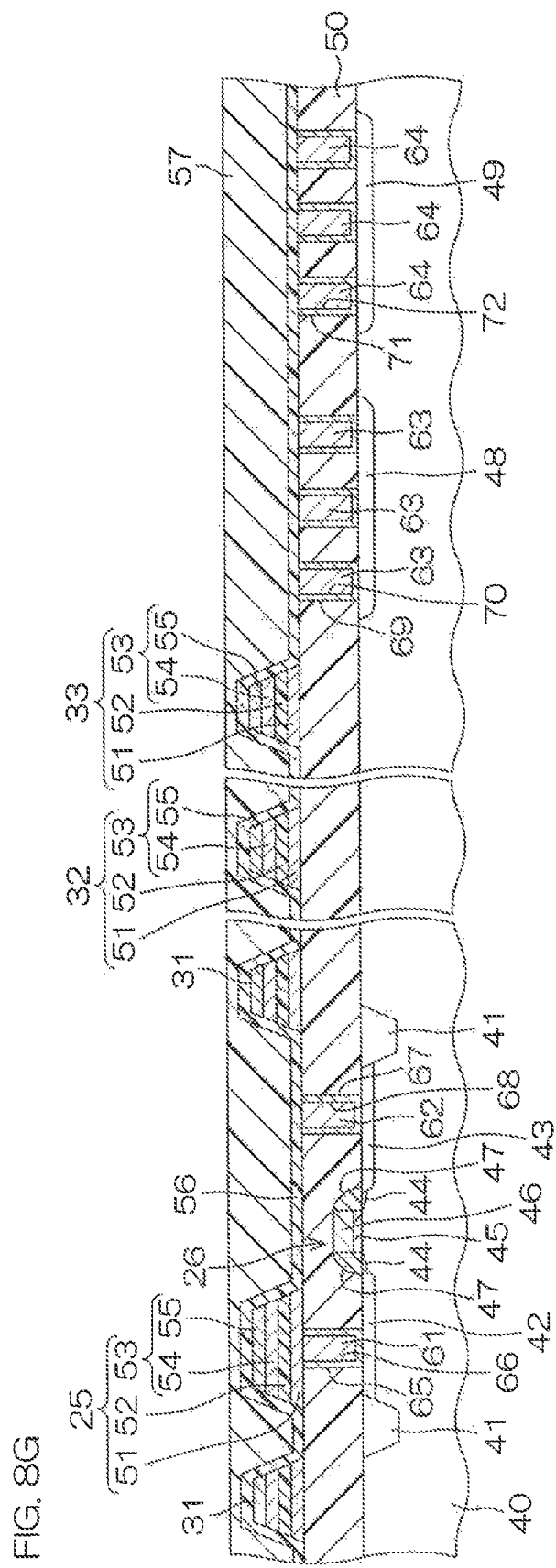

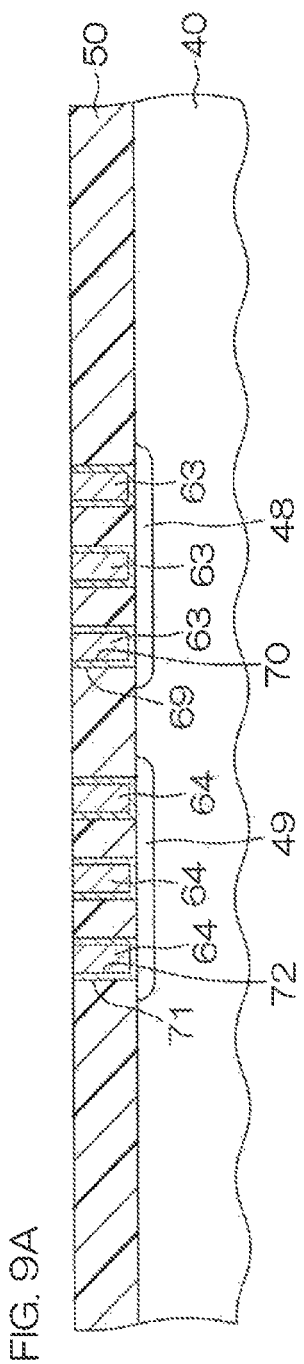

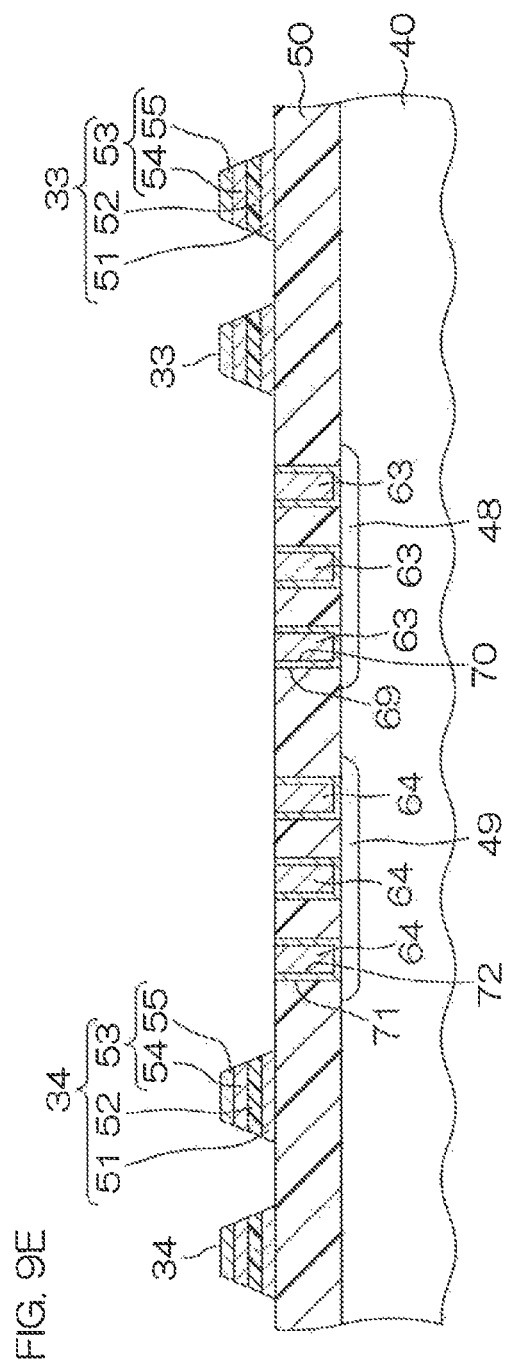

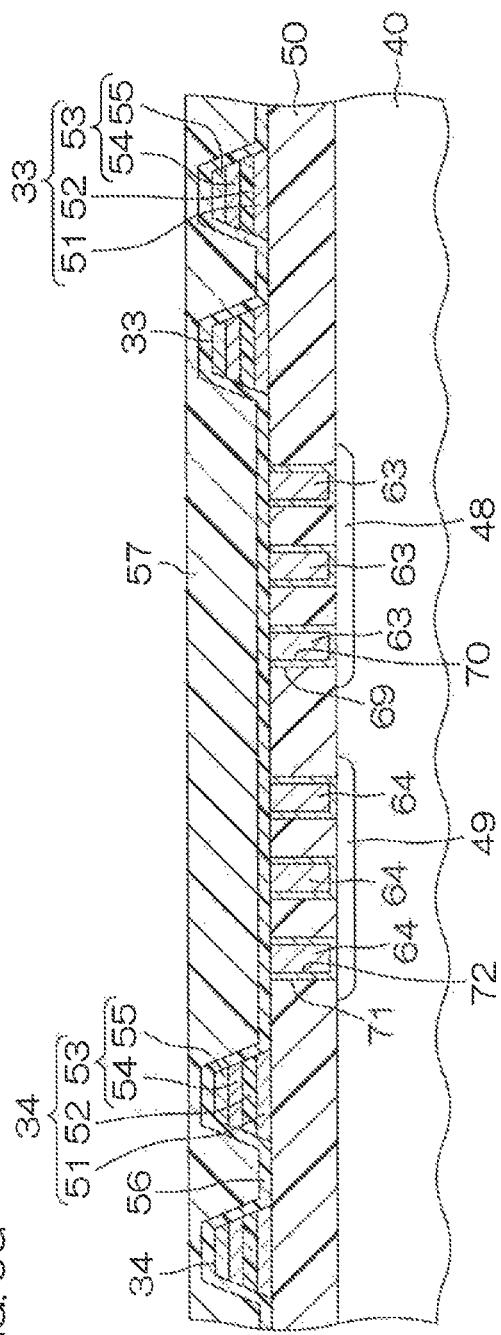

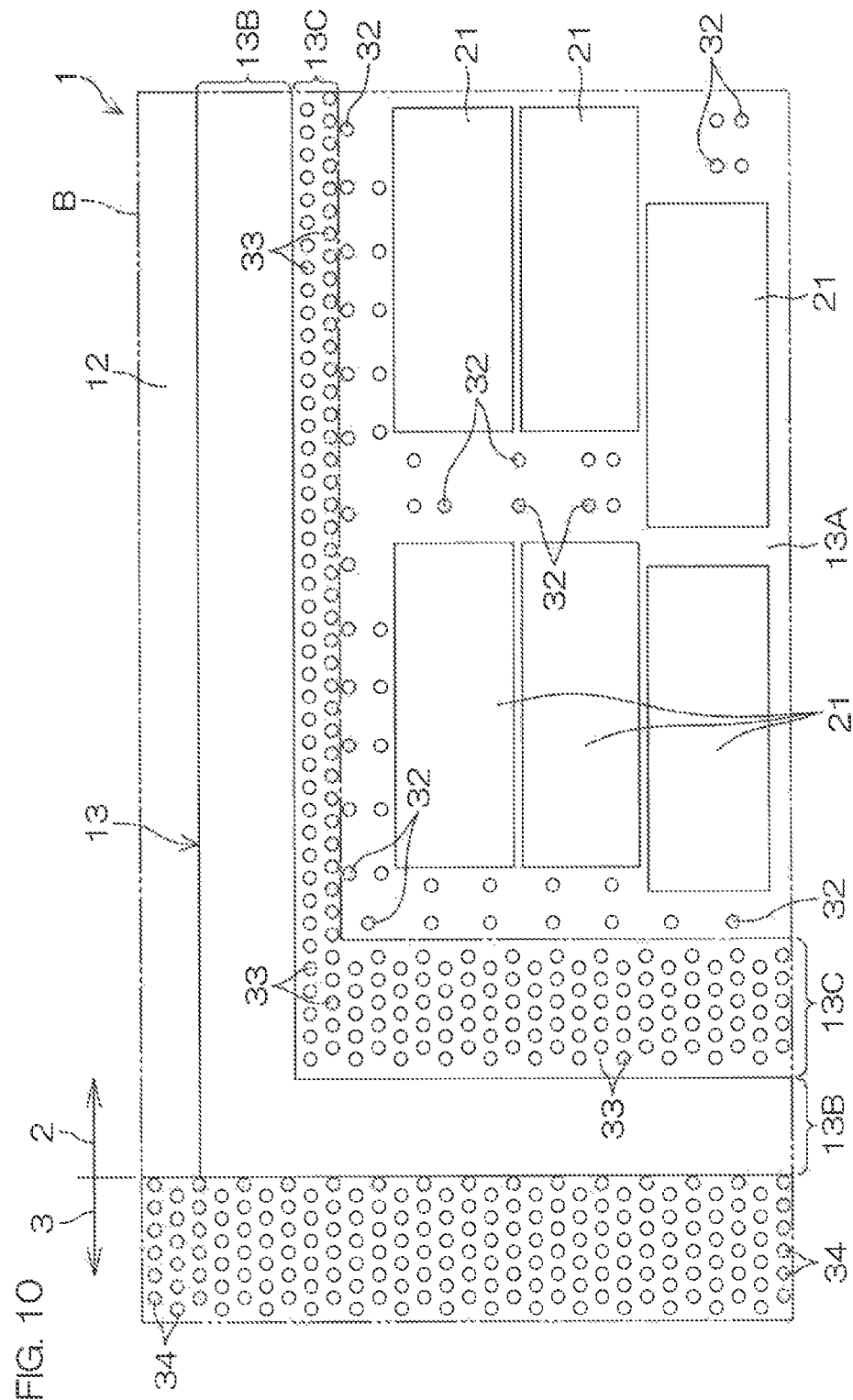

FERROELECTRIC MEMORY ARRAY SURROUNDED BY FERROELECTRIC DUMMY CAPACITORS

BACKGROUND OF THE INVENTION

1. Field of the Invention

The present invention relates to a semiconductor device including a nonvolatile storage element in turn including a ferroelectric capacitor.

2. Description of the Related Art

There are known nonvolatile memories and nonvolatile logics that store data by making use of hysteresis of a ferroelectric substance. As such type of nonvolatile memory, there is a ferroelectric memory (FeRAM: ferroelectric random access memory). A ferroelectric memory includes a plurality of memory cells. As disclosed, for example, in Japanese Patent Application Publication No. 2014-103426, each memory cell is constituted of a field effect transistor and a ferroelectric capacitor. The memory cell of the ferroelectric memory is an example of a nonvolatile storage element that includes a ferroelectric capacitor.

As disclosed in Japanese Patent Application Publication No. 2009-206942, the nonvolatile logic includes a plurality of nonvolatile logic cells (nonvolatile storage gates) and a control circuit controlling the nonvolatile logic cells. Each nonvolatile logic cell includes a volatile storage portion and a nonvolatile storage portion arranged to hold data of the volatile storage portion. The volatile storage portion is constituted, for example, of a flip-flop. The nonvolatile storage portion includes, for example, a plurality of ferroelectric capacitors and field effect transistors provided in correspondence to the respective ferroelectric capacitors. The nonvolatile logic cell is an example of a nonvolatile storage element that includes a ferroelectric capacitor. The control circuit, for example, saves data from the volatile storage portion to the nonvolatile storage portion, for example, when power is interrupted. On the other hand, the control circuit restores data from the nonvolatile storage portion to the volatile storage portion when power is turned on.

SUMMARY OF THE INVENTION

The inventor of preferred embodiments of the present invention described and claimed in the present application conducted an extensive study and research regarding a semiconductor device, such as the one described above, and in doing so, discovered and first recognized new unique challenges and previously unrecognized possibilities for improvements as described in greater detail below.

The ferroelectric capacitor used in the ferroelectric memory or nonvolatile logic mentioned above is, for example, formed above a first interlayer insulating film formed above a semiconductor substrate. The ferroelectric capacitor has a structure where a lower electrode, a ferroelectric film, and an upper electrode are laminated in that order above the first interlayer insulating film. When the ferroelectric film is reduced by hydrogen, ferroelectric characteristics degrade and therefore characteristics of the ferroelectric capacitor degrade. Therefore, in order to prevent the degradation of characteristics due to hydrogen reduction of the ferroelectric film, a front surface above the first interlayer insulating film and a front surface of the ferroelectric capacitor are ordinarily covered by a hydrogen barrier film. A second interlayer insulating film is formed above the hydrogen barrier film. The front surface of the ferroelectric capacitor is covered by the hydrogen barrier film and therefore even if a CVD method using hydrogen is adopted as a film forming method for the second interlayer insulating film, hydrogen reduction of the ferroelectric film can be prevented.

It has been found that even if the front surface of the ferroelectric capacitor is covered by the hydrogen barrier film, the characteristics of the ferroelectric capacitor degrade in a subsequent semiconductor device manufacturing process. As a result of investigating the cause, the inventors of the present application specified that the cause lies in a process of forming a barrier metal inside a via hole.

That is, various via holes, which penetrate through the second interlayer insulating film and the hydrogen barrier film, are formed in the second interlayer insulating film. A barrier metal is formed on inner surfaces (a side surface and a bottom surface) of each of the via holes. A plug is embedded inside the via hole with the barrier metal interposed therebetween. In forming the barrier metal inside the via hole, first, a barrier metal material film is formed above the second interlayer insulating film and on the via hole inner surfaces. Thereafter, modification processing using hydrogen is performed on the barrier metal material film to improve a barrier property of the barrier metal material film. The hydrogen used in the modification processing of the barrier metal material film passes through the via hole, the first interlayer insulating film, and the lower electrode of the ferroelectric capacitor to intrude into the ferroelectric film of the ferroelectric capacitor. The ferroelectric film of the ferroelectric capacitor is thereby hydrogen-reduced and the characteristics of the ferroelectric capacitor degrade.

An object of the present invention is to provide a semiconductor device, with which characteristics degradation of a ferroelectric capacitor can be suppressed.

In order to overcome the previously unrecognized and unsolved challenges described above, a preferred embodiment of the present invention provides a semiconductor device. The semiconductor device is a semiconductor device that includes a nonvolatile storage element, which in turn includes a ferroelectric capacitor, and includes a plurality of ferroelectric dummy capacitors formed in a periphery of the nonvolatile storage element.

With the present arrangement, hydrogen generated or used in a manufacturing process of the semiconductor device can be absorbed by the plurality of ferroelectric dummy capacitors formed in the periphery of the nonvolatile storage element. Characteristics degradation of the ferroelectric capacitor can thereby be suppressed.

In the preferred embodiment of the present invention, the semiconductor device includes a core region, in which a plurality of the nonvolatile storage elements are formed, a guard ring, disposed so as to surround the core region in plan view and including a plurality of via plugs, and a gap region between the core region and guard ring. The plurality of ferroelectric dummy capacitors formed in the peripheries of the nonvolatile storage elements include a plurality of ferroelectric dummy capacitors formed inside the gap region in plan view.

The guard ring includes the plurality of via plugs. To manufacture a via plug, first, after forming a via hole, a barrier metal is formed as a film on an inner surface of the via hole. Thereafter, modification processing using hydrogen is performed on the barrier metal. The via plug is then embedded inside the via hole with the barrier metal interposed therebetween. Hydrogen is used in modification-processing the barrier metal.

With this arrangement, the hydrogen used during modification processing of the barrier metal can be absorbed with good efficiency by the plurality of ferroelectric dummy capacitors formed inside the gap region. Characteristics degradation of the ferroelectric capacitor can thereby be suppressed more effectively.

In the preferred embodiment of the present invention, the plurality of ferroelectric dummy capacitors formed inside the gap region are disposed in lattice form in plan view.

In the preferred embodiment of the present invention, the plurality of ferroelectric dummy capacitors formed inside the gap region are disposed in staggered form in plan view.

In the preferred embodiment of the present invention, the plurality of ferroelectric dummy capacitors formed in the peripheries of the nonvolatile storage elements include a plurality of ferroelectric dummy capacitors that are disposed in peripheries of the nonvolatile storage elements inside the core region in plan view.

In the preferred embodiment of the present invention, the semiconductor device includes a semiconductor substrate and a first interlayer insulating film formed above the semiconductor substrate. Also, the ferroelectric capacitor and the ferroelectric dummy capacitors are formed above the first interlayer insulating film. Each of the ferroelectric capacitor and the ferroelectric dummy capacitors includes a lower electrode formed above the first interlayer insulating film, a ferroelectric film formed above the lower electrode, and an upper electrode formed above the ferroelectric film.

In the preferred embodiment of the present invention, a hydrogen barrier film, covering front surfaces of the ferroelectric capacitor, the ferroelectric dummy capacitors, and the first interlayer insulating film, and a second interlayer insulating film, formed above the hydrogen barrier film, are further included.

In the preferred embodiment of the present invention, the guard ring includes a ground line and a power supply line of annular shapes in plan view that are formed above the second interlayer insulating film, a plurality of grounding plugs embedded in the second interlayer insulating film and electrically connected to the ground line, and a plurality of power supply plugs embedded in the second interlayer insulating film and electrically connected to the power supply line. Each of the grounding plugs is embedded inside a grounding hole, penetrating through the second interlayer insulating film and the hydrogen barrier film, with a barrier metal, formed on an inner surface of the grounding hole, interposed therebetween. Each of the power supply plugs is embedded inside a power supply hole, penetrating through the second interlayer insulating film and the hydrogen barrier film, with a barrier metal, formed on an inner surface of the power supply hole, interposed therebetween.

In the preferred embodiment of the present invention, the nonvolatile storage element is a nonvolatile logic cell including a volatile storage portion and a nonvolatile storage portion having the ferroelectric capacitor and arranged to hold data of the volatile storage portion.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8D is a schematic sectional view of a step subsequent to that of FIG. 8C.

FIG. 8E is a schematic sectional view of a step subsequent to that of FIG. 8D.

FIG. 8G is a schematic sectional view of a step subsequent to that of FIG. 8F.

FIG. 8O is a schematic sectional view of a step subsequent to that of FIG. 8N.

FIG. 9A is a sectional view for describing an example of a process for mainly manufacturing dummy capacitors, formed in a scribe region and a gap region, and the guard ring and is a sectional view corresponding to FIG. 7.

FIG. 9E is a schematic sectional view of a step subsequent to that of FIG. 9D.

FIG. 9G is a schematic sectional view of a step subsequent to that of FIG. 9F.

FIG. 9I is a schematic sectional view of a step subsequent to that of FIG. 9H.

FIG. 10 is a plan view of another arrangement example of third dummy capacitors formed in the gap region and another arrangement example of fourth dummy capacitors formed in the scribe region and is a plan view corresponding to FIG. 5.

DETAILED DESCRIPTION OF THE PREFERRED EMBODIMENTS

Preferred embodiments of the present invention shall now be described in detail with reference to the attached drawings.

Figure 1:
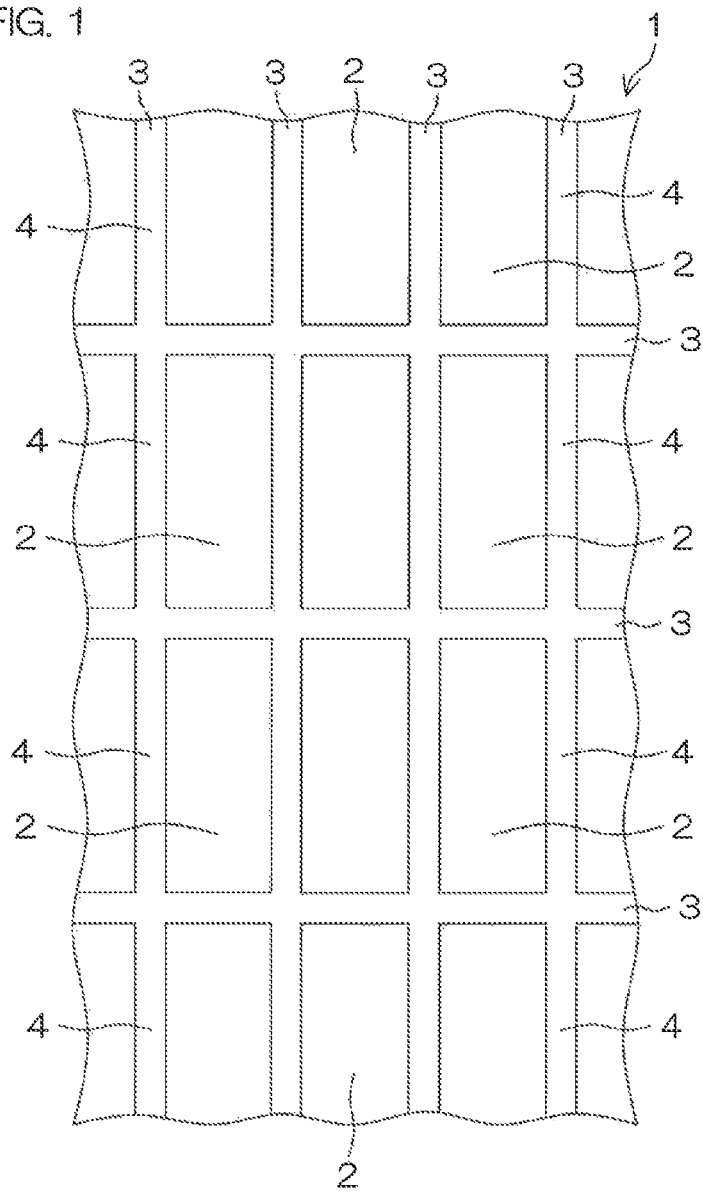
FIG. 1 is an illustrative plan view of a semiconductor wafer after a wafer process for preparing a semiconductor device according to a preferred embodiment of the present invention.

FIG. 1 is an illustrative plan view of a semiconductor wafer after a wafer process for preparing a semiconductor device according to a preferred embodiment of the present invention. The semiconductor wafer 1 has a plurality of functional element regions 2 and a scribe region 3 formed so as to surround the respective functional element regions 2. In the plan view shown in FIG. 1, each functional element region 2 is rectangular. In the plan view shown in FIG. 1, the respective functional element regions 2 are laid out and disposed in an array at intervals in a vertical direction and a lateral direction. Portions between adjacent functional element regions 2 constitute the scribe region 3. The semiconductor wafer 1 is cut along the scribe region 3 by a dicing blade. Semiconductor devices (chips) 4, each including the functional element region 2, are thereby cut out. Each semiconductor device 4 has the scribe region 3 at a peripheral edge portion and has the functional element region 2 at a central region surrounded by the scribe region 3.

Figure 2:
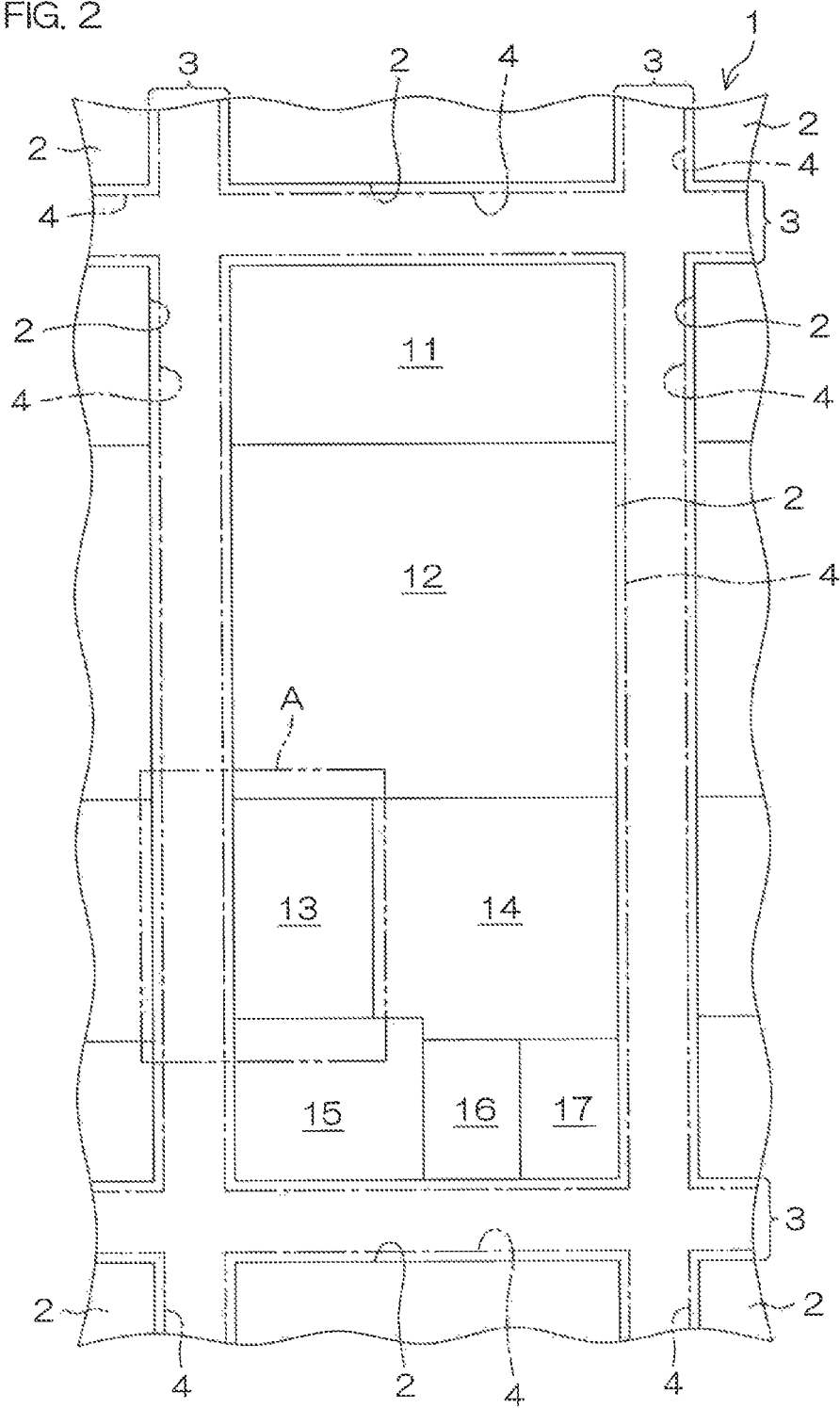
FIG. 2 is a partially enlarged plan view showing a portion of FIG. 1 in enlarged manner.

FIG. 2 is a partially enlarged plan view showing a portion of FIG. 1 in enlarged manner.

A functional element having functions of the semiconductor device 4 is formed in each functional element region 2. In the present preferred embodiment, the functional element region 2 includes a power transistor region 11, an analog circuit region 12, a nonvolatile logic region 13, a logic region 14, an SRAM region 15, a CPU region 16, a ROM region 17, etc. A power transistor is formed inside the power transistor region 11. An analog circuit is formed inside the analog circuit region 12. A nonvolatile logic is formed inside the nonvolatile logic region 13. A logic circuit is formed inside the logic region 14. An SRAM is formed inside the SRAM region 15. A CPU is formed inside the CPU region 16. A ROM is formed inside the ROM region 17. The nonvolatile logic region 13 may be included inside the logic region 14.

Figure 3:
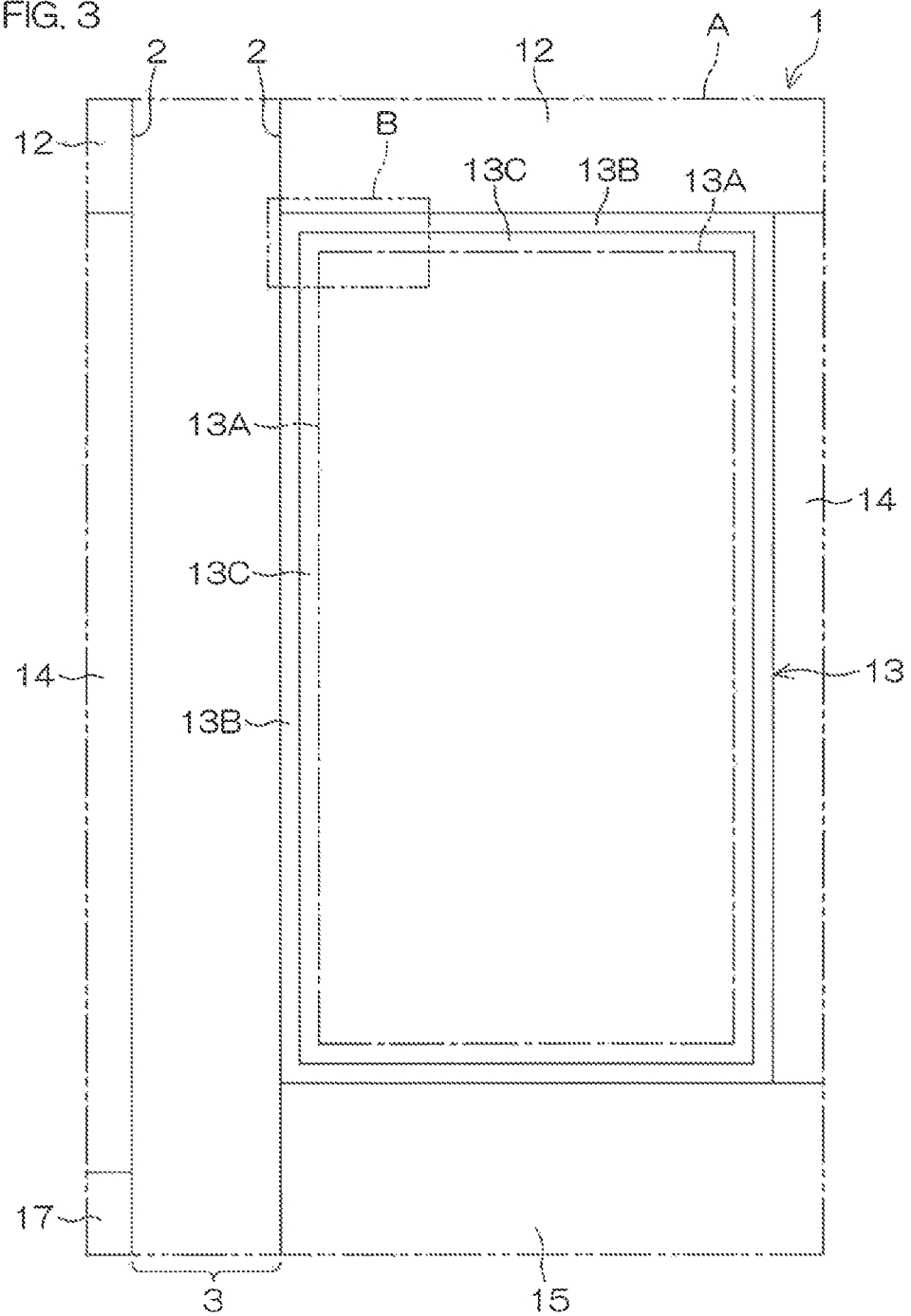
FIG. 3 is a partially enlarged plan view showing a portion A of FIG. 2 in enlarged manner.

FIG. 3 is a partially enlarged plan view showing a portion A of FIG. 2 in enlarged manner.

The nonvolatile logic region 13 includes a core region 13A of rectangular shape in plan view in which the nonvolatile logic is formed, a guard ring 13B of rectangular annular shape in plan view that is formed so as to surround the core region 13A, and a region (hereinafter referred to as the "gap region 13C") of rectangular annular shape in plan view between the core region 13A and the guard ring 13B.

The guard ring 13B is formed so as to extend around a peripheral edge portion of the nonvolatile logic region 13.

Figure 4:
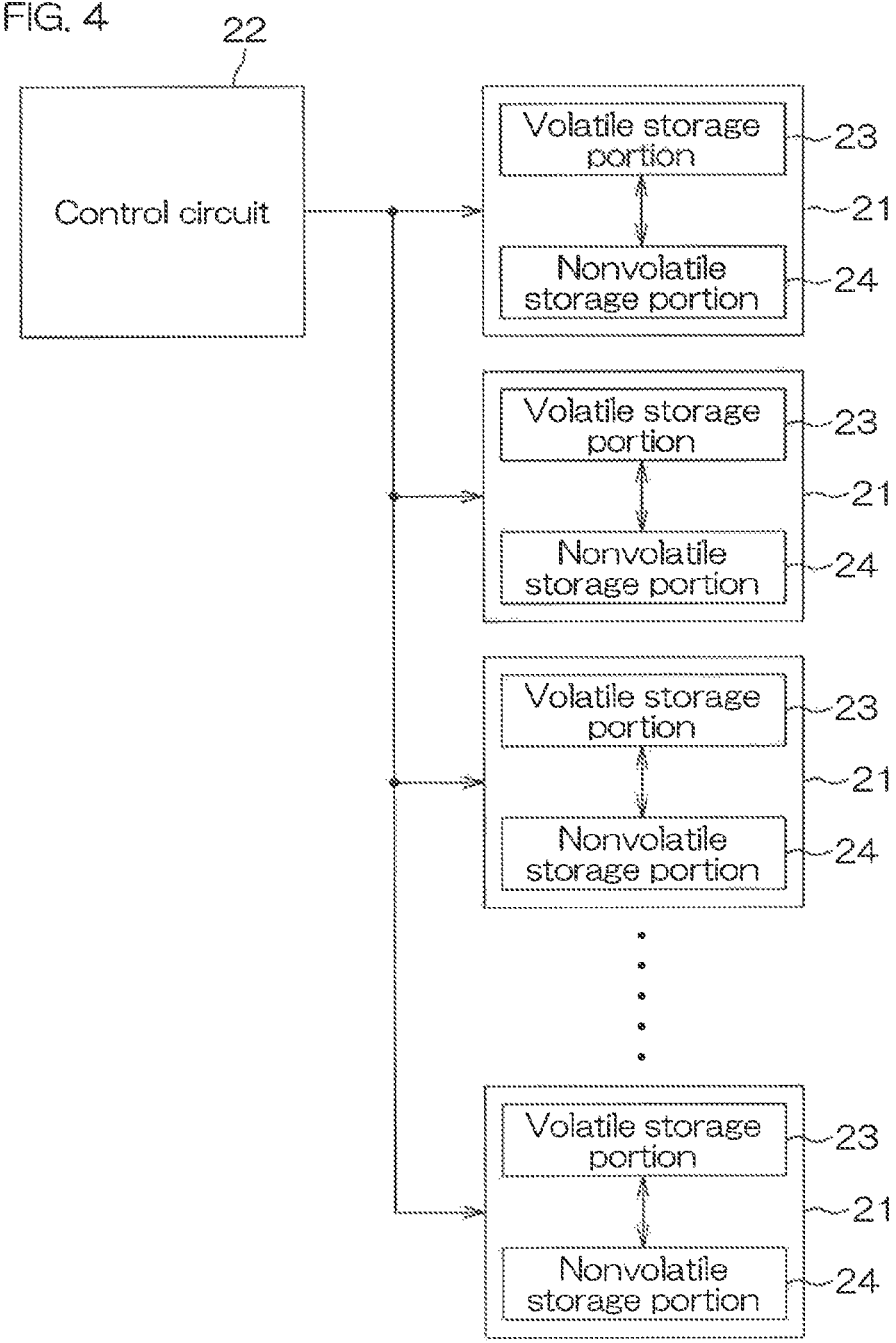
FIG. 4 is a block diagram of the electrical arrangement of a nonvolatile logic.

FIG. 4 is a block diagram of the electrical arrangement of a nonvolatile logic.

The nonvolatile logic includes a plurality of nonvolatile logic cells (nonvolatile storage elements) 21 and a control circuit 22 controlling the nonvolatile logic cells 21. In the present preferred embodiment, each nonvolatile logic cell 21 includes a volatile storage portion 23 and a nonvolatile storage portion 24 arranged to store data (a state) of the volatile storage portion 23. In the present preferred embodiment, the volatile storage portion 23 is constituted of a flip-flop. In the present preferred embodiment, the nonvolatile storage portion 24 includes a plurality of (for example, four) ferroelectric capacitors and includes MOS field effect transistors (MOSFET: metal oxide semiconductor field effect transistors) provided in correspondence to the respective ferroelectric capacitors. The control circuit 22, for example, saves data from each volatile storage portion 23 to the corresponding nonvolatile storage portion 24 when power is interrupted. On the other hand, the control circuit 22 restores data from each nonvolatile storage portion 24 to the corresponding volatile storage portion 23 when power is turned on. The nonvolatile logic cell 21 is an example of a nonvolatile storage element according to the present invention. As such a nonvolatile logic cell 21, a nonvolatile storage gate disclosed in Japanese Patent Application Publication No. 2009-206942 may be used.

Figure 5:
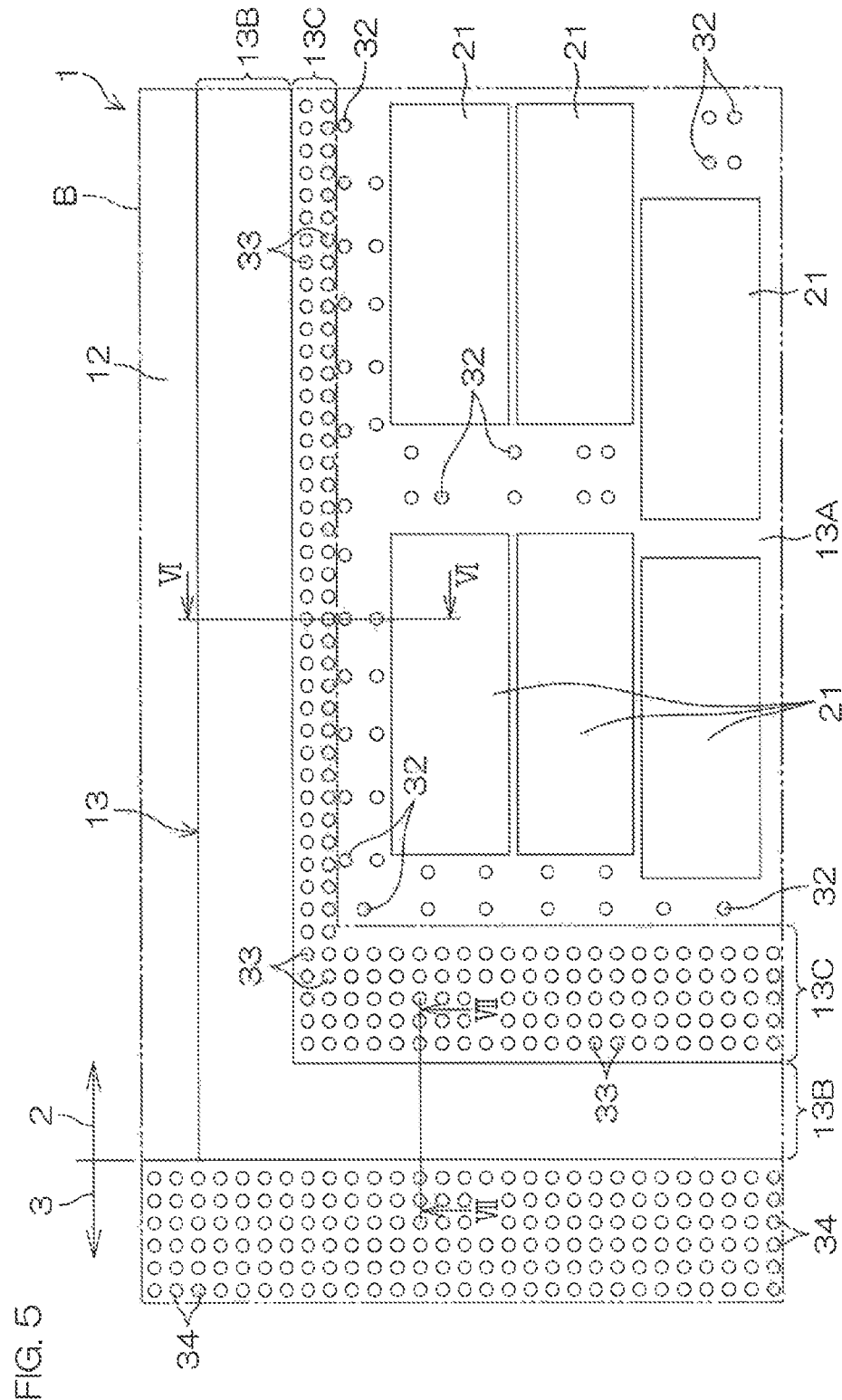
FIG. 5 is a plan view showing a B portion of FIG. 3 in enlarged manner.

FIG. 5 is a plan view showing a portion B of FIG. 3 in enlarged manner.

A plurality of nonvolatile logic cells 21 are formed in the core region 13A. In plan view, the plurality of nonvolatile logic cells 21 are disposed substantially in a matrix at intervals in a vertical direction and a lateral direction. Each nonvolatile logic cell 21 includes the flip-flop (not shown) as the volatile storage portion 23 and the ferroelectric capacitors 25 (see FIG. 6) and the Z 26 (see FIG. 6) included in the nonvolatile storage portion 24.

In plan view, ferroelectric dummy capacitors 31 (see FIG. 6; hereinafter referred to as the "first dummy capacitors 31") are formed in an interior of each nonvolatile logic cell 21 in the core region 13A. Also, in plan view, a plurality of ferroelectric dummy capacitors 32 (hereinafter referred to as the "second dummy capacitors 32") are formed at an exterior of the nonvolatile logic cells 21 in the core region 13A. Also, in plan view, a plurality of ferroelectric dummy capacitors 33 (hereinafter referred to as the "third dummy capacitors 33") are formed in the gap region 13C. The third dummy capacitors 33 are formed in a lattice along the guard ring 13B in plan view.

A plurality of ferroelectric dummy capacitors 34 (hereinafter referred to as the "fourth dummy capacitors 34") are formed in an entirety of the scribe region 3 of the semiconductor wafer 1. The fourth dummy capacitors 34 are formed in a lattice along sides of each functional element region 2 in plan view.

The guard ring 13B includes a ground line 95 (see FIG. 6), formed annularly in plan view, and plugs 83 and 63 (see FIG. 6), electrically connected thereto, and a power supply line 96 (see FIG. 6), disposed so as to surround the ground line 95, and plugs 84 and 64 (see FIG. 6), electrically connected thereto.

Figure 6:
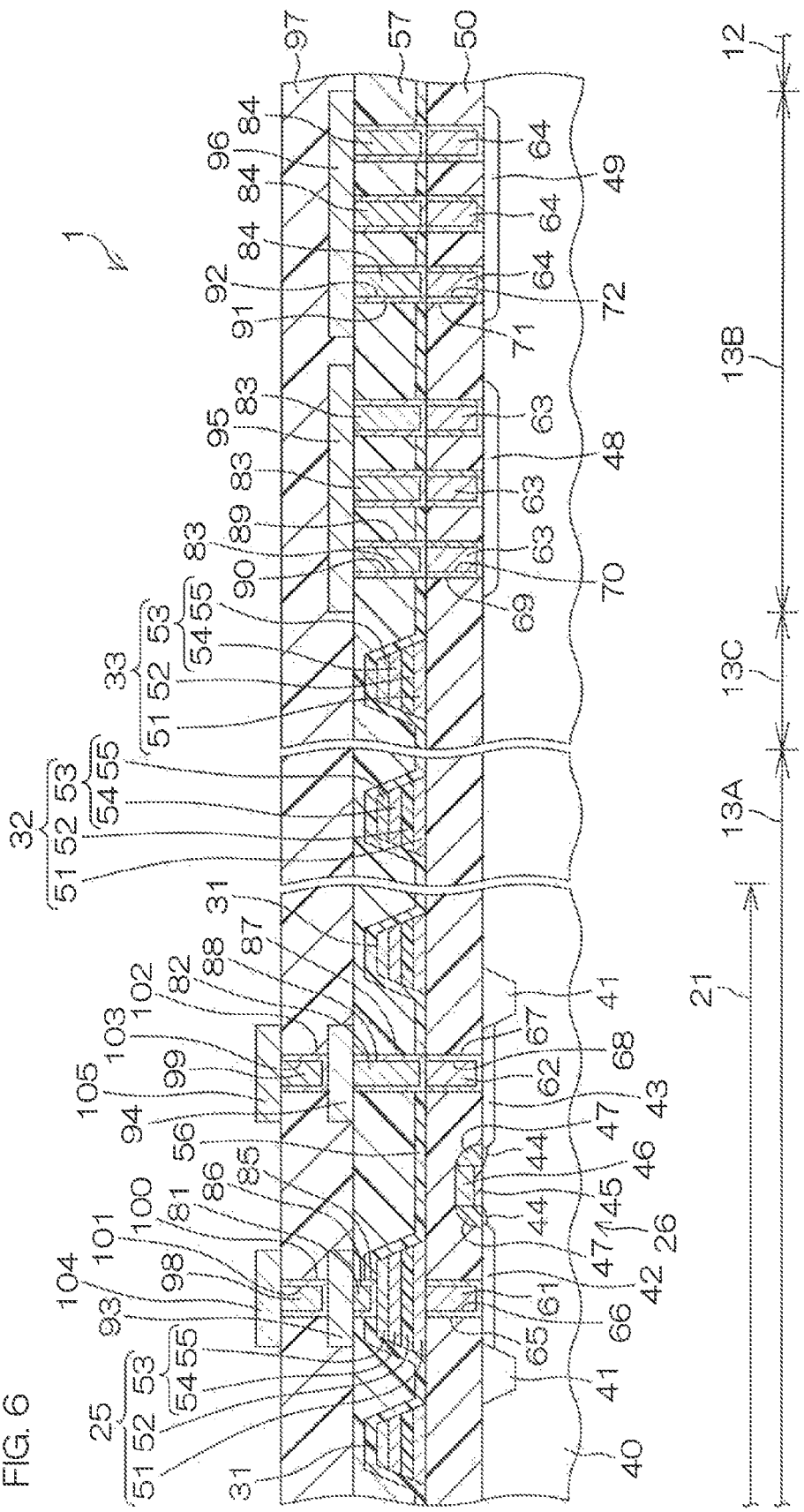
FIG. 6 is a schematic sectional view taken along line VI-VI in FIG. 5.
Figure 7:
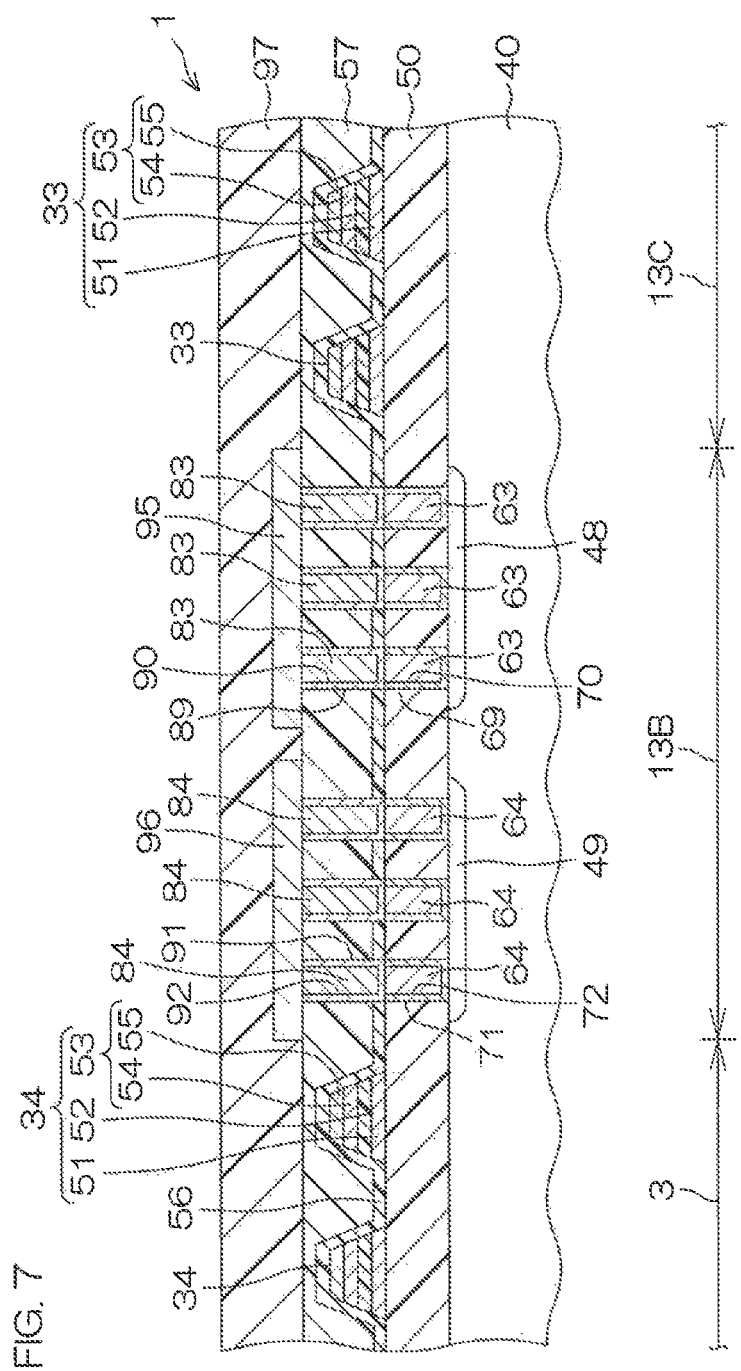
FIG. 7 is a schematic sectional view taken along line VII-VII in FIG. 5.

FIG. 6 is a schematic sectional view taken along line VI-VI in FIG. 5. That is, FIG. 6 is a schematic sectional view of a region including the guard ring 13B, the gap region 13C, and one nonvolatile logic cell 21 in the nonvolatile logic region 13. FIG. 7 is a schematic sectional view taken along line VII-VII in FIG. 5. That is, FIG. 7 is a schematic sectional view of a vicinity of a boundary portion between the nonvolatile logic region 13 and the scribe region 3.

The semiconductor wafer 1 includes a semiconductor substrate 40. The semiconductor substrate 40 is, for example, an Si (silicon) substrate. The MOSFETs 26 are formed above the semiconductor substrate 40. Active regions that are electrically element-isolated by element isolating regions 41 are formed in a surface layer portion of the semiconductor substrate 40. An $n^+$ type drain region 42 and a source region 43 are disposed inside each active region. $n^-$ type high resistance regions 44 are disposed at edge portion regions in the drain regions 42 and source regions 43 at sides at which these regions face each other.

Above the semiconductor substrate 40, a gate insulating film 45 is disposed to face a channel region between the drain region 42 and the source region 43. The gate insulating film is constituted, for example, of $SiO_2$. A gate electrode 46 is disposed above the gate insulating film 45. The gate electrode 46 is constituted, for example, of polysilicon doped with a high concentration of an n type impurity. A side wall 47 is disposed at a periphery of the gate electrode 46. Entire peripheries of side surfaces of the gate insulating film 45 and the gate electrode 46 are covered by the side wall 47. The side wall 47 is constituted, for example, of SiN or $SiO_2$. Although not appearing in FIG. 6, functional elements, each constituting the flip-flop as the volatile storage portion 23, are formed above the semiconductor substrate 40 in the core region 13A.

In a region in which the guard ring 13B is to be disposed, a p type diffusion region 48 of rectangular annular shape in plan view that is formed so as to surround the gap region 13C and an n type diffusion region 49 of rectangular annular shape in plan view that is formed so as to surround the p type diffusion region 48 are formed in the surface layer portion of the semiconductor substrate 40.

A first interlayer insulating film 50 is formed above the semiconductor substrate 40. The first interlayer insulating film 50 is constituted, for example, of $SiO_2$.

Each ferroelectric capacitor 25 is formed above the first interlayer insulating film 50 at a position at which at least a portion thereof overlaps with the corresponding drain region 42 in plan view. The ferroelectric capacitor 25 has a structure where a lower electrode 51, a ferroelectric film 52, and an upper electrode 53 are laminated in that order above the first interlayer insulating film 50. In other words, the ferroelectric capacitor 25 has a laminated structure in which the ferroelectric film 52 is interposed between the lower electrode 51 and the upper electrode 53 that faces it. In the present preferred embodiment, the ferroelectric capacitor 25 is formed to a mesa shape (trapezoidal shape in sectional view).

The lower electrode 51 is constituted of a conductive material that includes a noble metal, such as Ir, etc. The ferroelectric film 52 is constituted of PZT. The upper electrode 53 includes an electrode lower layer 54 constituted of a conductive material that includes Ir and an electrode upper layer 55 constituted of TiN that is laminated above the electrode lower layer 54. More specifically, the electrode lower layer 54 has a structure where an $IrO_2$ (iridium oxide) film, an Ir film, an $IrO_2$ film, and an Ir film are laminated in that order above the ferroelectric film 52. The Ir film has a hydrogen barrier property.

The first dummy capacitors 31 are formed above the first interlayer insulating film 50 inside each nonvolatile logic cell 21. The second dummy capacitors 32 are formed above the first interlayer insulating film 50 at the exterior of the nonvolatile logic cells 21 inside the core region 13A. The third dummy capacitors 33 are formed above the first interlayer insulating film 50 inside the gap region 13C. Referring to FIG. 7, the fourth dummy capacitors 34 are formed above the first interlayer insulating film 50 inside the scribe region 3. Layer structures of the dummy capacitors 31, 32, 33, and 34 are the same as the layer structure of the ferroelectric capacitor 25. That is, each of the dummy capacitors 31, 32, 33, and 34 has a structure where a lower electrode 51, a ferroelectric film 52, and an upper electrode 53 are laminated in that order above the first interlayer insulating film 50. However, the lower electrodes 51 and the upper electrodes 53 of the dummy capacitors 31, 32, 33, and 34 are not electrically connected to a wiring member, such as a contact plug, via plug, wiring, etc. That is, the dummy capacitors 31, 32, 33, and 34 are electrically isolated capacitors. The dummy capacitors 31, 32, 33, and 34 are formed to mesa shapes.

Respective front surfaces of the ferroelectric capacitors 25, the dummy capacitors 31, 32, 33, and 34, and the first interlayer insulating film 50 are covered by a hydrogen barrier film 56 arranged to prevent characteristics degradation of the ferroelectric films 52 due to hydrogen reduction. The hydrogen barrier film 56 is constituted, for example, of $Al_2O_3$.

A second interlayer insulating film 57 is laminated above the hydrogen barrier film 56. The second interlayer insulating film 57 is constituted, for example, of $SiO_2$.

In the first interlayer insulating film 50 are embedded first contact plugs 61, each of which is electrically connected to the corresponding drain region 42 and the lower electrode 51 of the corresponding ferroelectric capacitor 25, second contact plugs 62, each of which is electrically connected to the corresponding source region 43, a plurality of third contact plugs 63, electrically connected to the p type diffusion region 48, and a plurality of fourth contact plugs 64, electrically connected to the n type diffusion region 49. The third contact plugs 63 are provided in plurality at intervals in a width direction and a length direction (peripheral direction) of the p type diffusion region 48 of rectangular annular shape in plan view. Similarly, the fourth contact plugs 64 are provided in plurality at intervals in a width direction and a length direction (peripheral direction) of the n type diffusion region 49 of rectangular annular shape in plan view.

Between each drain region 42 and the lower electrode 51 of the corresponding ferroelectric capacitor 25 is formed a first contact hole 65 that penetrates through the first interlayer insulating film 50. A barrier metal 66 is formed on a side surface of each first contact hole 65 and above a portion of the drain region 42 facing the first contact hole 65. The barrier metal 66 is constituted, for example, of TiN. Each first contact plug 61 is embedded in the corresponding first contact hole 65 with the barrier metal 66 interposed therebetween. The first contact plug 61 is constituted, for example, of W (tungsten).

Above each source region 43 is formed a second contact hole 67 that penetrates through the first interlayer insulating film 50. A barrier metal 68 is formed on a side surface of each second contact hole 67 and above a portion of the source region 43 facing the second contact hole 67. The barrier metal 68 is constituted of the same material as the barrier metal 66. Each second contact plug 62 is embedded in the corresponding second contact hole 67 with the barrier metal 68 interposed therebetween. The second contact plug 62 is constituted of the same material as the first contact plug 61.

Above the p type diffusion region 48, are formed a plurality of third contact holes 69 that penetrate through the first interlayer insulating film 50. A barrier metal 70 is formed on a side surface of each third contact hole 69 and above a portion of the p type diffusion region 48 facing the third contact hole 69. The barrier metal 70 is constituted of the same material as the barrier metal 66. Each third contact plug 63 is embedded in the corresponding third contact hole 69 with the barrier metal 70 interposed therebetween. The third contact plug 63 is constituted of the same material as the first contact plug 61.

Above the n type diffusion region 49, are formed a plurality of fourth contact holes 71 that penetrate through the first interlayer insulating film 50. A barrier metal 72 is formed on a side surface of each fourth contact hole 71 and above a portion of the n type diffusion region 49 facing the fourth contact hole 71. The barrier metal 72 is constituted of the same material as the barrier metal 66. Each fourth contact plug 64 is embedded in the corresponding fourth contact hole 71 with the barrier metal 72 interposed therebetween. The fourth contact plug 64 is constituted of the same material as the first contact plug 61.

In the second interlayer insulating film 57 are embedded first via plugs 81, each of which is electrically connected to the upper electrode 53 of the corresponding ferroelectric capacitor 25, second via plugs 82, each of which is electrically connected to the corresponding second contact plug 62, third via plugs 83, each of which is electrically connected to the corresponding third contact plug 63, and fourth via plugs 84, each of which is electrically connected to the corresponding fourth contact plug 64.

Specifically, above the upper electrode 53 of each ferroelectric capacitor 25 is formed a first via hole 85. The first via hole 85 penetrates through the second interlayer insulating film 57, further penetrates through the hydrogen barrier film 56, and reaches an intermediate portion of the electrode upper layer 55 of the upper electrode 53 of the ferroelectric capacitor 25. A barrier metal 86 is formed on a side surface of each first via hole 85 and above a portion of the electrode upper layer 55 facing the first via hole 85. The barrier metal 86 is constituted, for example, of TiN. Each first via plug 81 is embedded in the corresponding first via hole 85 with the barrier metal 86 interposed therebetween. The first via plug 81 is constituted, for example, of W (tungsten).

Above each second contact plug 62 is formed a second via hole 87. The second via hole 87 penetrates through the second interlayer insulating film 57, further penetrates through the hydrogen barrier film 56, and reaches the second contact plug 62. A barrier metal 88 is formed on a side surface of each second via hole 87 and above a portion of the second contact plug 62 facing the second via hole 87. The barrier metal 88 is constituted of the same material as the barrier metal 86. Each second via plug 82 is embedded in the corresponding second via hole 87 with the barrier metal 88 interposed therebetween. The second via plug 82 is constituted of the same material as the first via plug 81.

Above each third contact plug 63 is formed a third via hole 89. The third via hole 89 penetrates through the second interlayer insulating film 57, further penetrates through the hydrogen barrier film 56, and reaches the third contact plug 63. A barrier metal 90 is formed on a side surface of each third via hole 89 and above a portion of the third contact plug 63 facing the third via hole 89. The barrier metal 90 is constituted of the same material as the barrier metal 86. Each third via plug 83 is embedded in the corresponding third via hole 89 with the barrier metal 90 interposed therebetween. The third via plug 83 is constituted of the same material as the first via plug 81.

Above each fourth contact plug 64 is formed a fourth via hole 91. The fourth via hole 91 penetrates through the second interlayer insulating film 57, further penetrates through the hydrogen barrier film 56, and reaches the fourth contact plug 64. A barrier metal 92 is formed on a side surface of each fourth via hole 91 and above a portion of the fourth contact plug 64 facing the fourth via hole 91. The barrier metal 92 is constituted of the same material as the barrier metal 86. Each fourth via plug 84 is embedded in the corresponding fourth via hole 91 with the barrier metal 92 interposed therebetween. The fourth via plug 84 is constituted of the same material as the first via plug 81.

Above the second interlayer insulating film 57 are formed first wirings 93, each electrically connected to the corresponding first via plug 81, second wirings 94, each electrically connected to the corresponding second via plug 82, the ground line 95, electrically connected to the third via plugs 83, and the power supply line 96, electrically connected to the fourth via plugs 84. A third interlayer insulating film 97, covering the wirings 93 and 94, the ground line 95, and the power supply line 96, is formed above the second interlayer insulating film 57. The third interlayer insulating film 97 is constituted, for example, of $SiO_2$.

In the third interlayer insulating film 97 are embedded fifth via plugs 98, each of which is electrically connected to the corresponding first wiring 93, and sixth via plugs 99, each of which is electrically connected to the corresponding second wiring 94.

Specifically, above each first wiring 93 is formed a fifth via hole 100. The fifth via hole 100 penetrates through the third interlayer insulating film 97 and reaches the first wiring 93. A barrier metal 101 is formed on a side surface of each fifth via hole 100 and above a portion of the first wiring 93 facing the fifth via hole 100. The barrier metal 101 is constituted, for example, of TiN. Each fifth via plug 98 is embedded in the corresponding fifth via hole 100 with the barrier metal 101 interposed therebetween. The fifth via plug 98 is constituted, for example, of W (tungsten).

Above each second wiring 94 is formed a sixth via hole 102. The sixth via hole 102 penetrates through the third interlayer insulating film 97 and reaches the second wiring 94. A barrier metal 103 is formed on a side surface of each sixth via hole 102 and above a portion of the second wiring 94 facing the sixth via hole 102. The barrier metal 103 is constituted of the same material as the barrier metal 101. Each sixth via plug 99 is embedded in the corresponding sixth via hole 102 with the barrier metal 103 interposed therebetween. The sixth via plug 99 is constituted of the same material as the fifth via plug 98.

Above the third interlayer insulating film 97 are formed third wirings 104, each electrically connected to the corresponding fifth via plug 98, and fourth wirings 105, each electrically connected to the corresponding sixth via plug 99.

Preferably, a dummy capacitor is not formed at a position below a location through which a wiring passes above the second interlayer insulating film 57. The reason for this is that when a dummy capacitor is formed below a wiring, a parasitic capacitor is formed at that portion and may cause delay of transmission of a signal passing through the wiring.

Figure 8A:
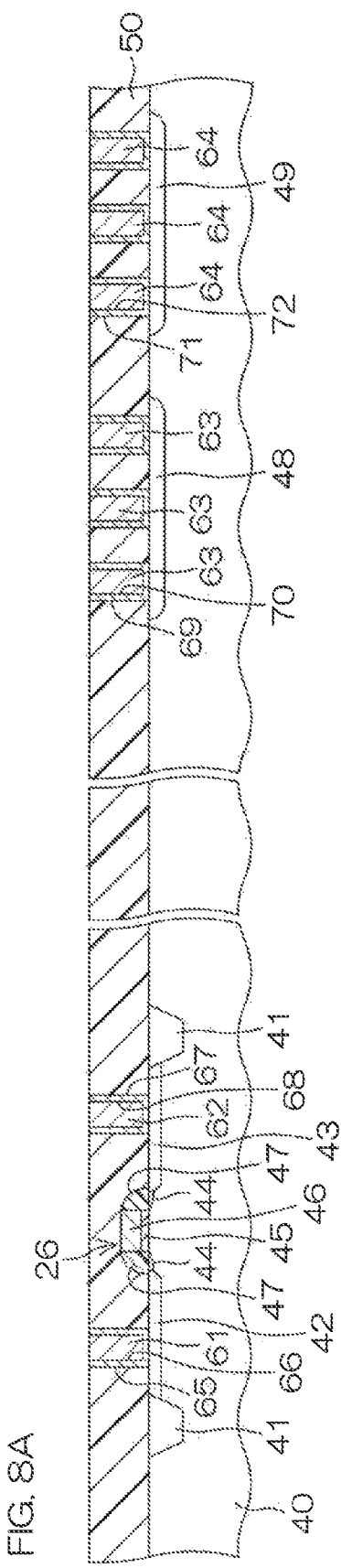
FIG. 8A is a sectional view for describing an example of a process for mainly manufacturing a nonvolatile logic cell, dummy capacitors formed in a periphery of the nonvolatile logic cell, and a guard ring and is a sectional view corresponding to FIG. 6.
Figure 8B:
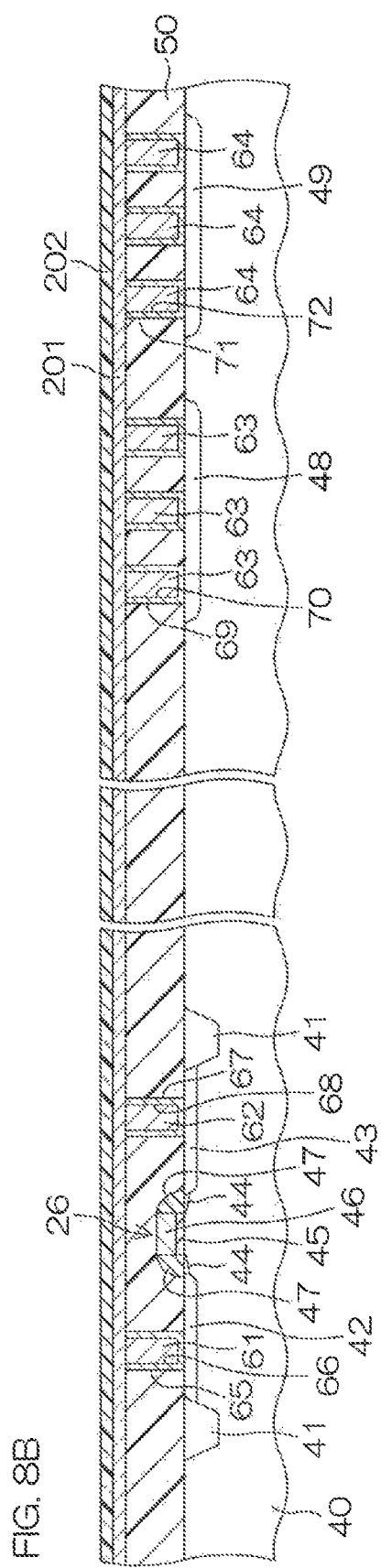
FIG. 8B is a schematic sectional view of a step subsequent to that of FIG. 8A.
Figure 8C:
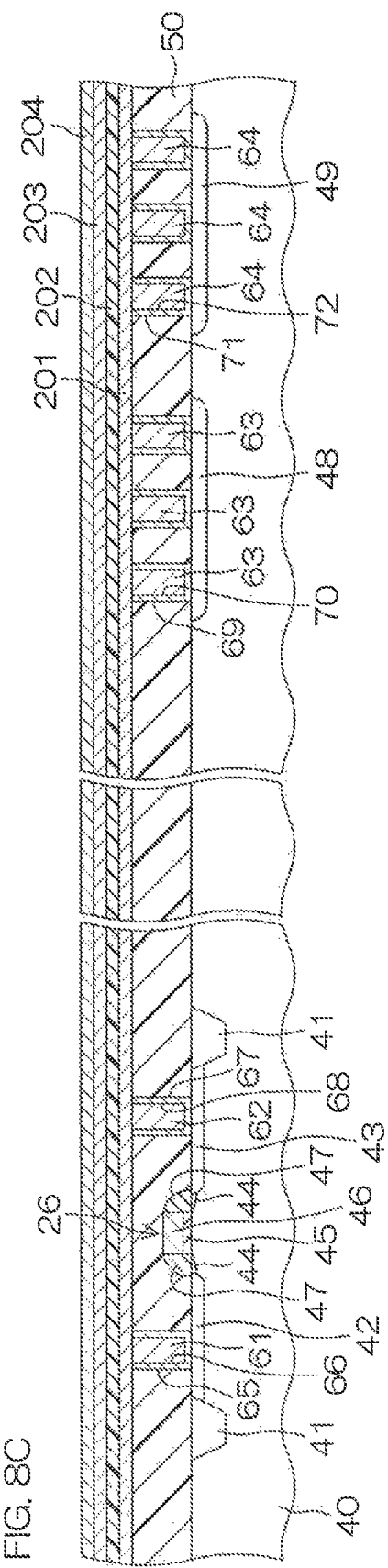
FIG. 8C is a schematic sectional view of a step subsequent to that of FIG. 8B.
Figure 8F:
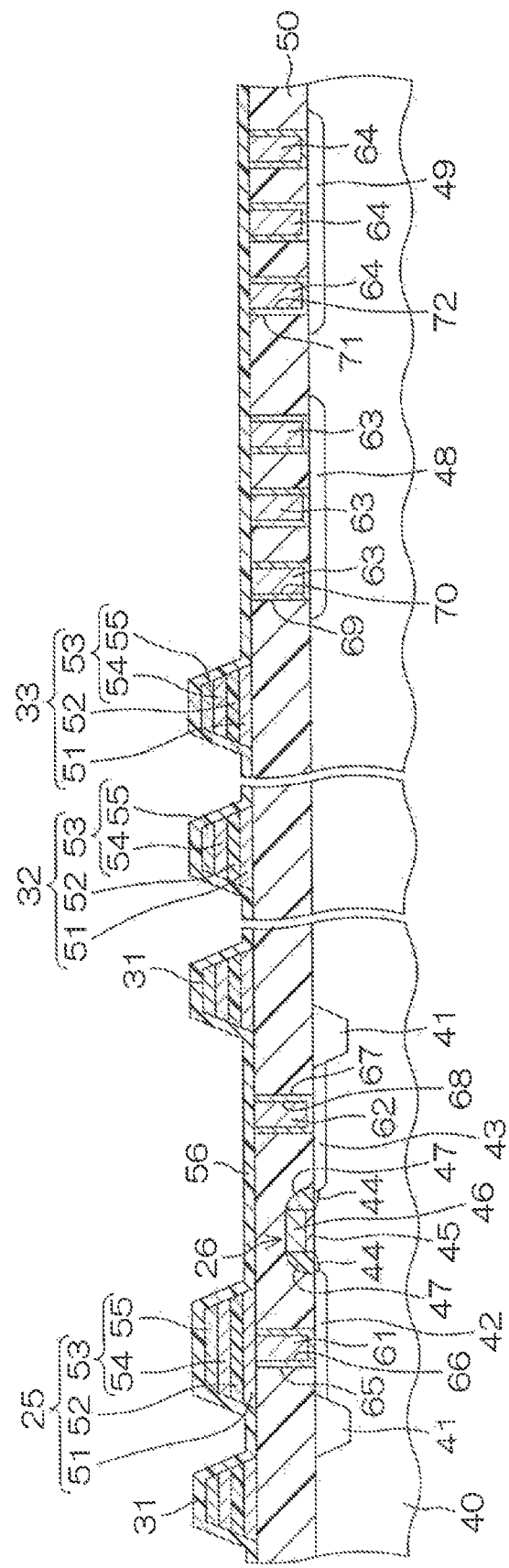
FIG. 8F is a schematic sectional view of a step subsequent to that of FIG. 8E.
Figure 8H:
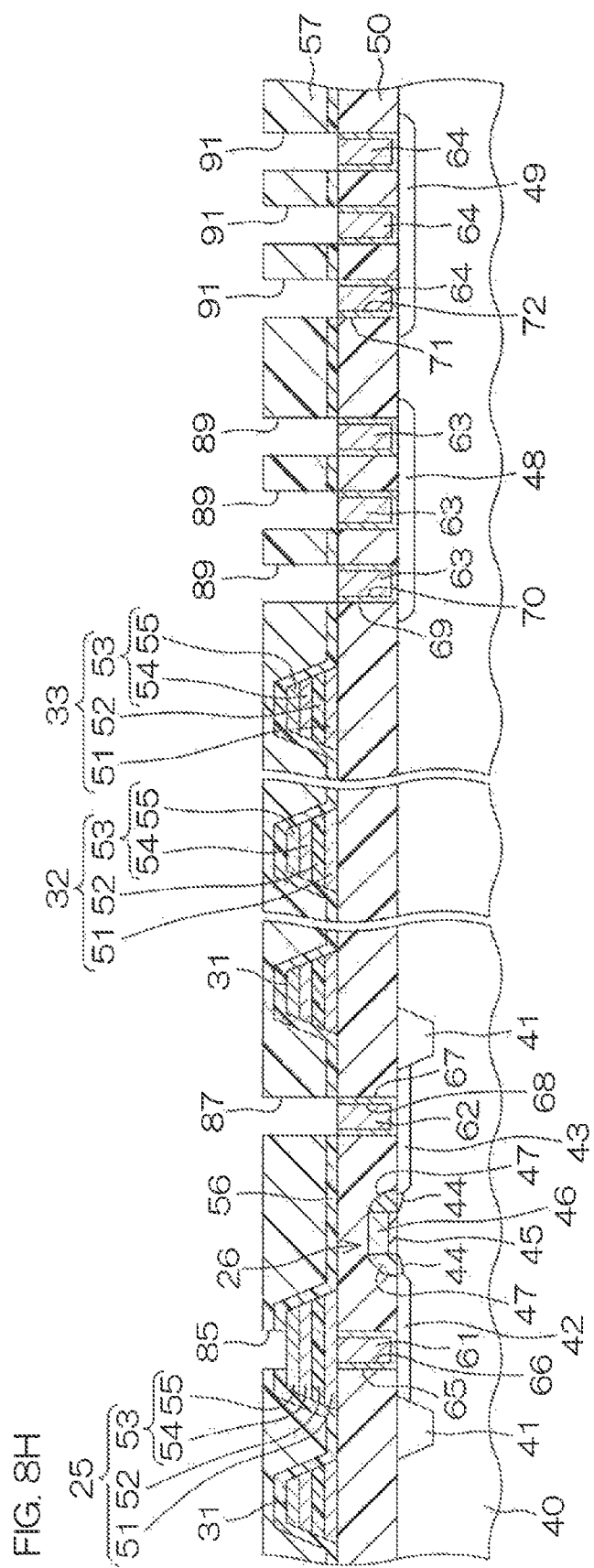
FIG. 8H is a schematic sectional view of a step subsequent to that of FIG. 8G.
Figure 8I:
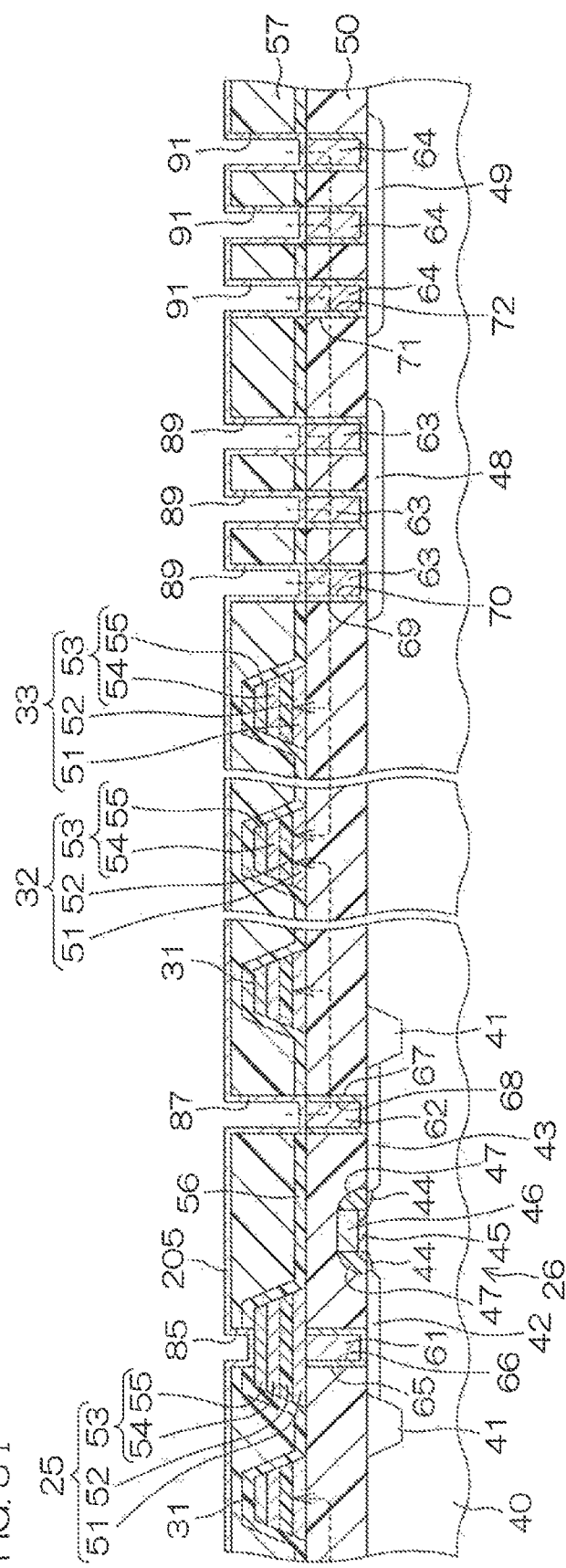
FIG. 8I is a schematic sectional view of a step subsequent to that of FIG. 8H.
Figure 8J:
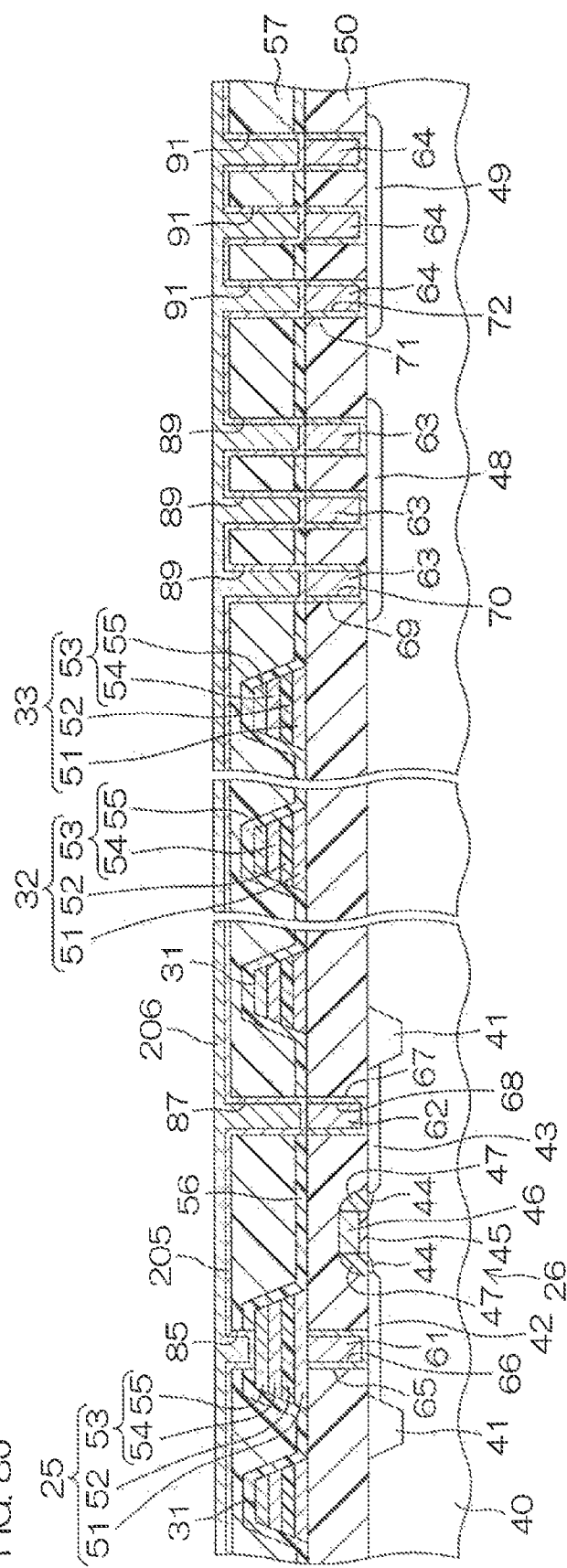
FIG. 8J is a schematic sectional view of a step subsequent to that of FIG. 8I.
Figure 8K:
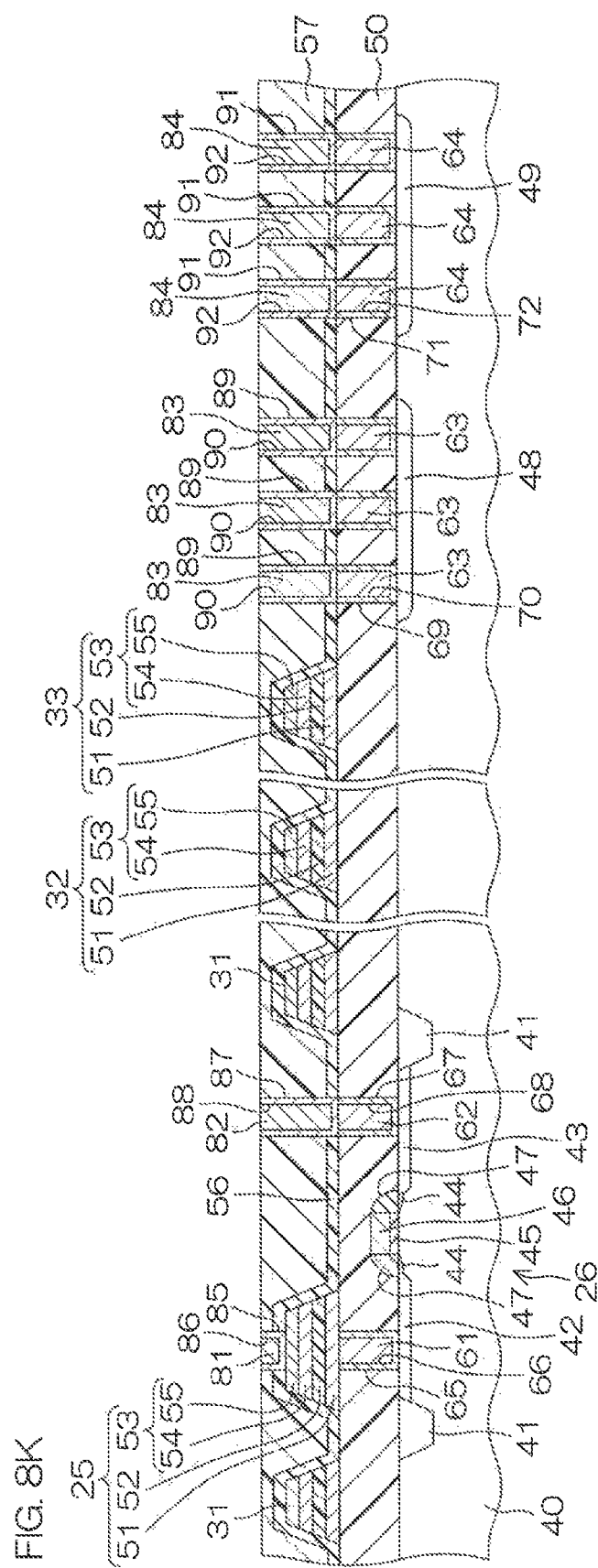
FIG. 8K is a schematic sectional view of a step subsequent to that of FIG. 8J.
Figure 8L:
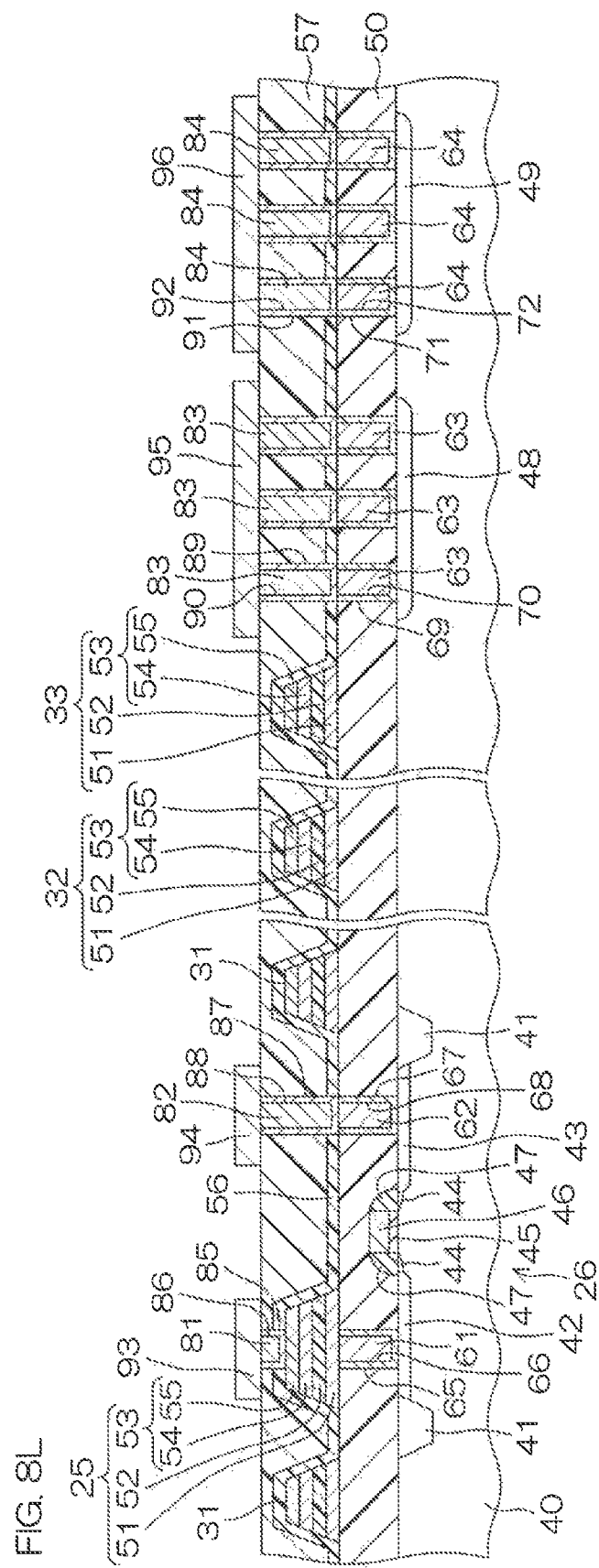
FIG. 8L is a schematic sectional view of a step subsequent to that of FIG. 8K.
Figure 8M:
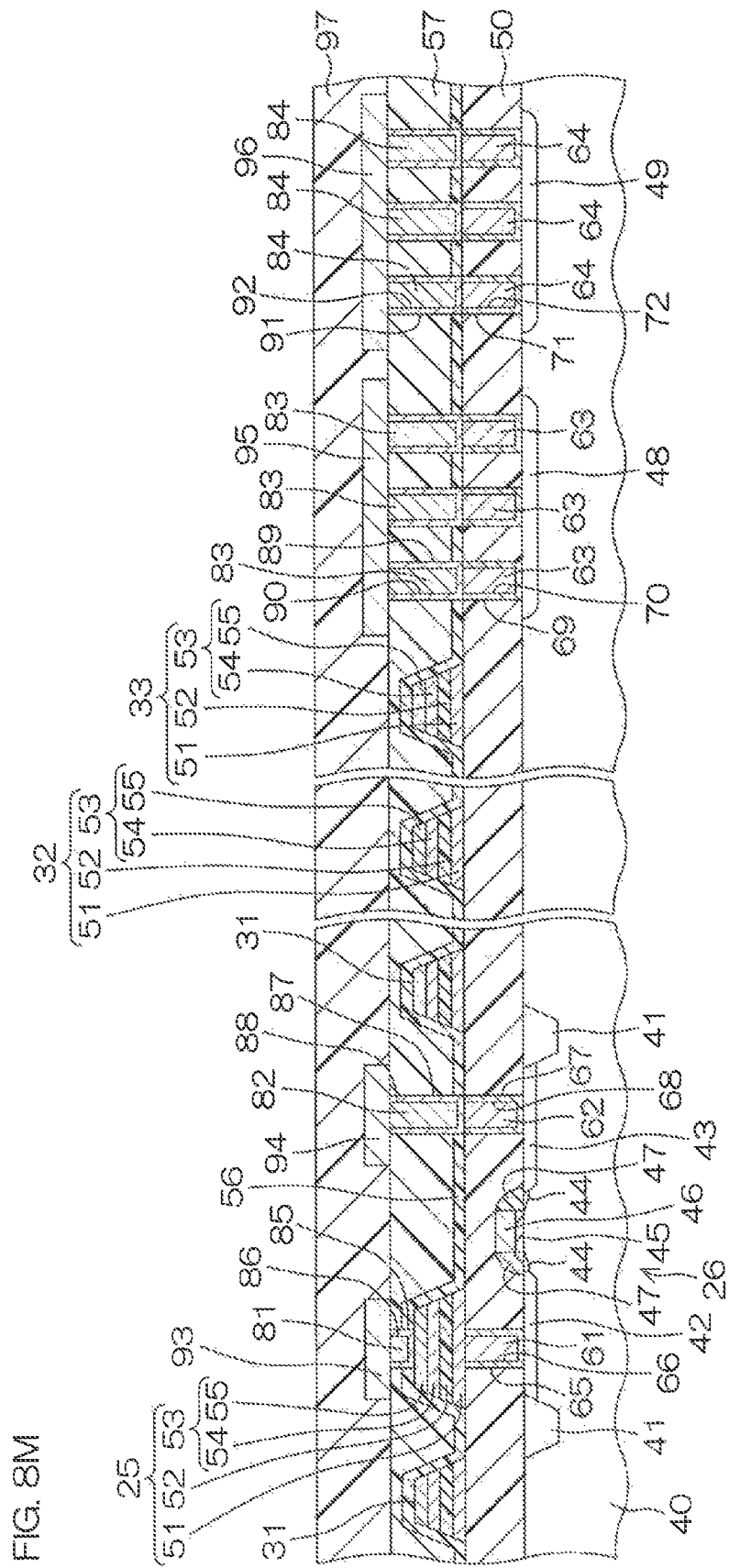
FIG. 8M is a schematic sectional view of a step subsequent to that of FIG. 8L.
Figure 8N:
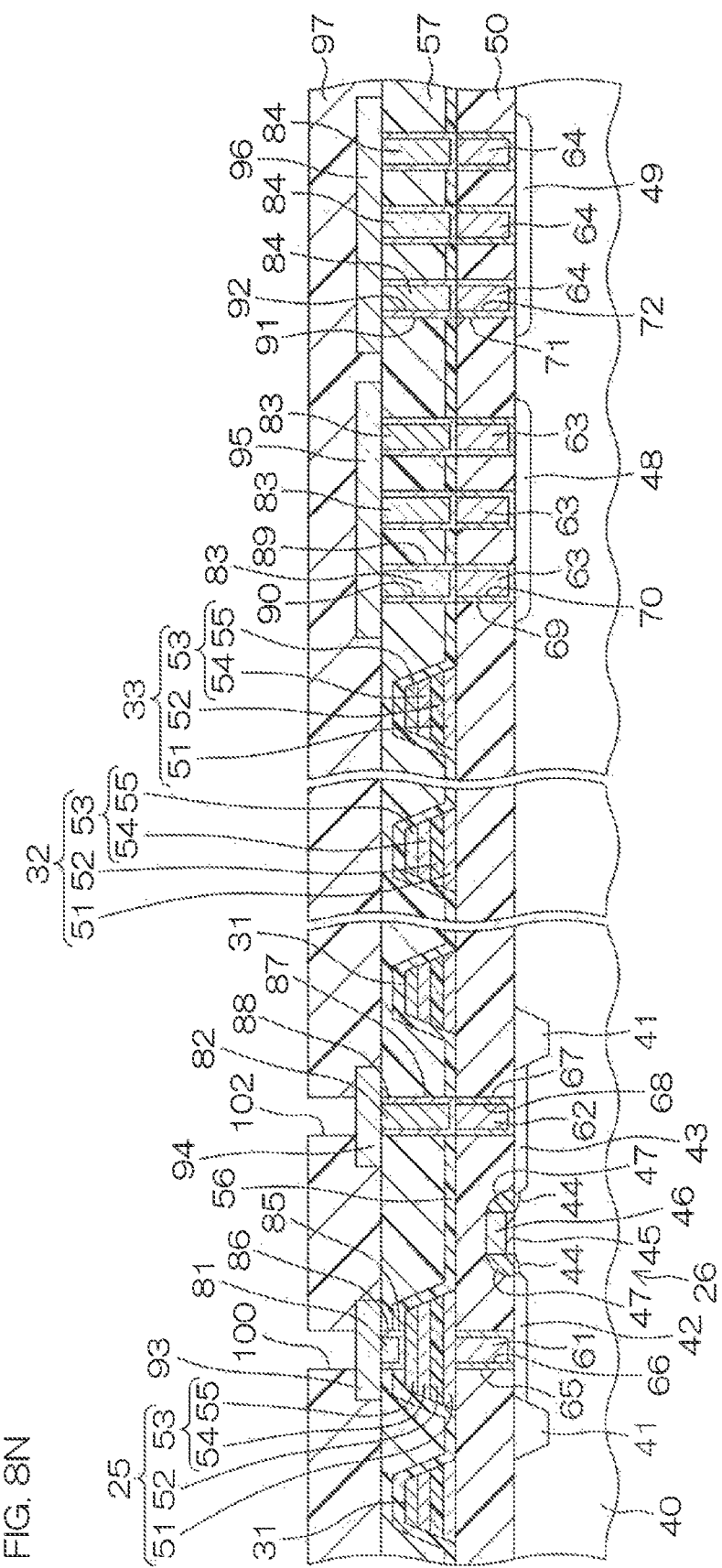
FIG. 8N is a schematic sectional view of a step subsequent to that of FIG. 8M.
Figure 80:
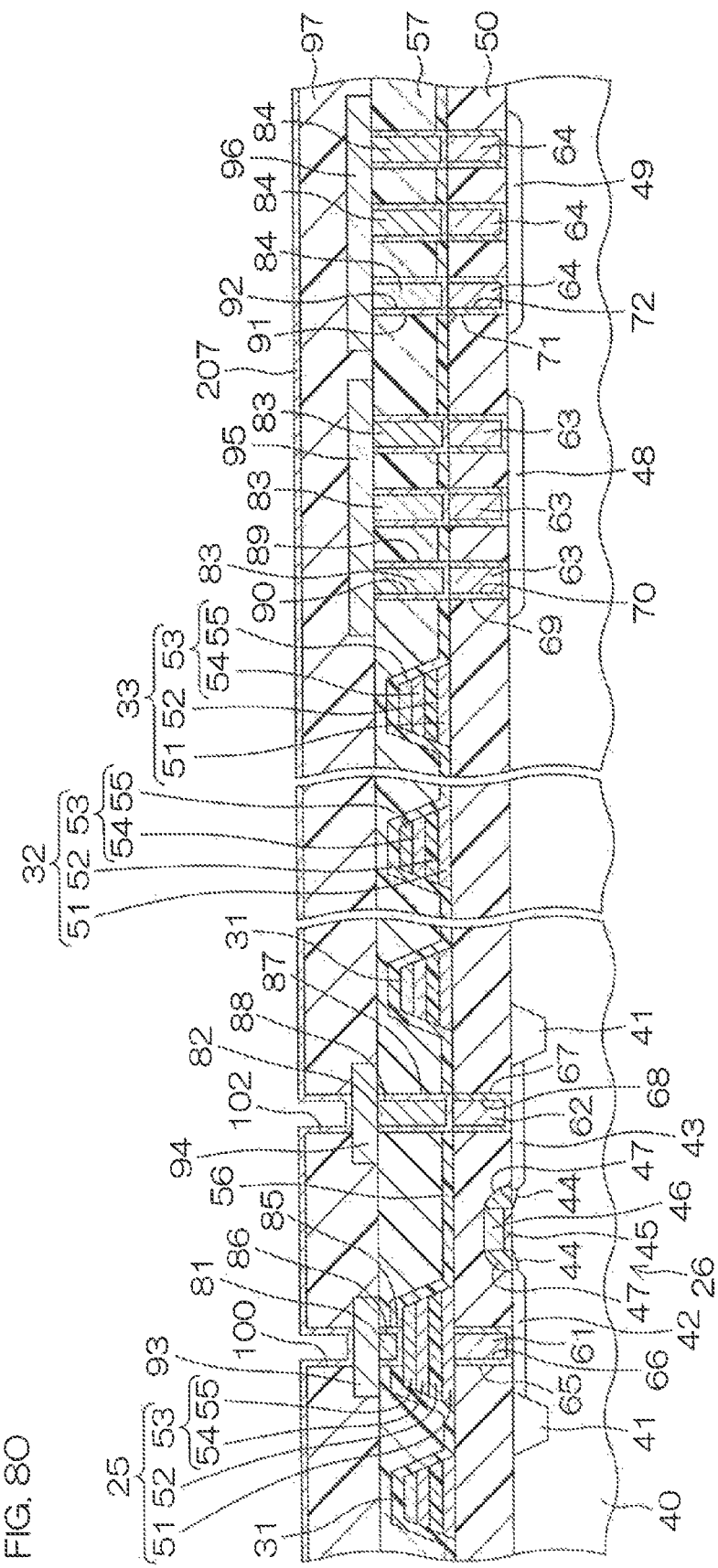
Figure 8P:
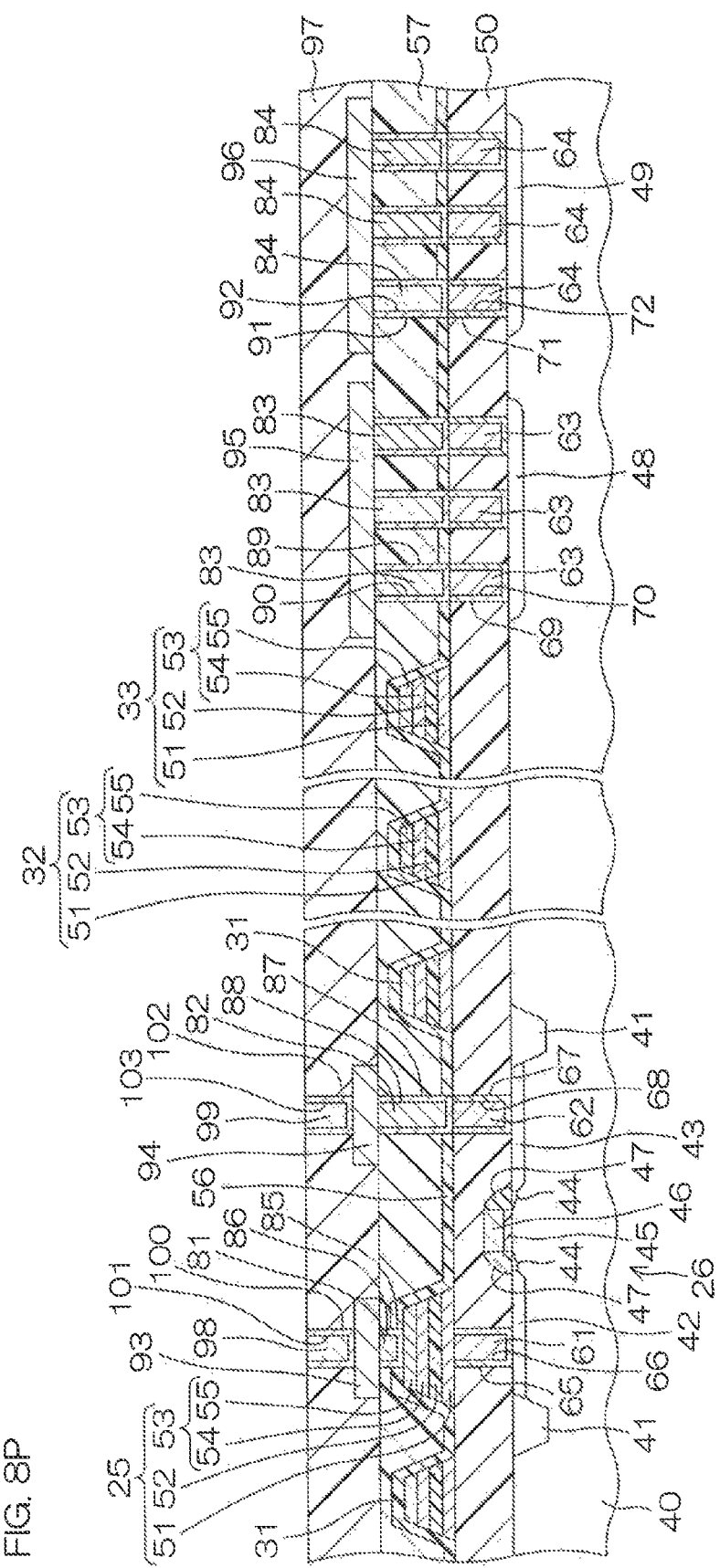
FIG. 8P is a schematic sectional view of a step subsequent to that of FIG. 8O.
Figure 8Q:
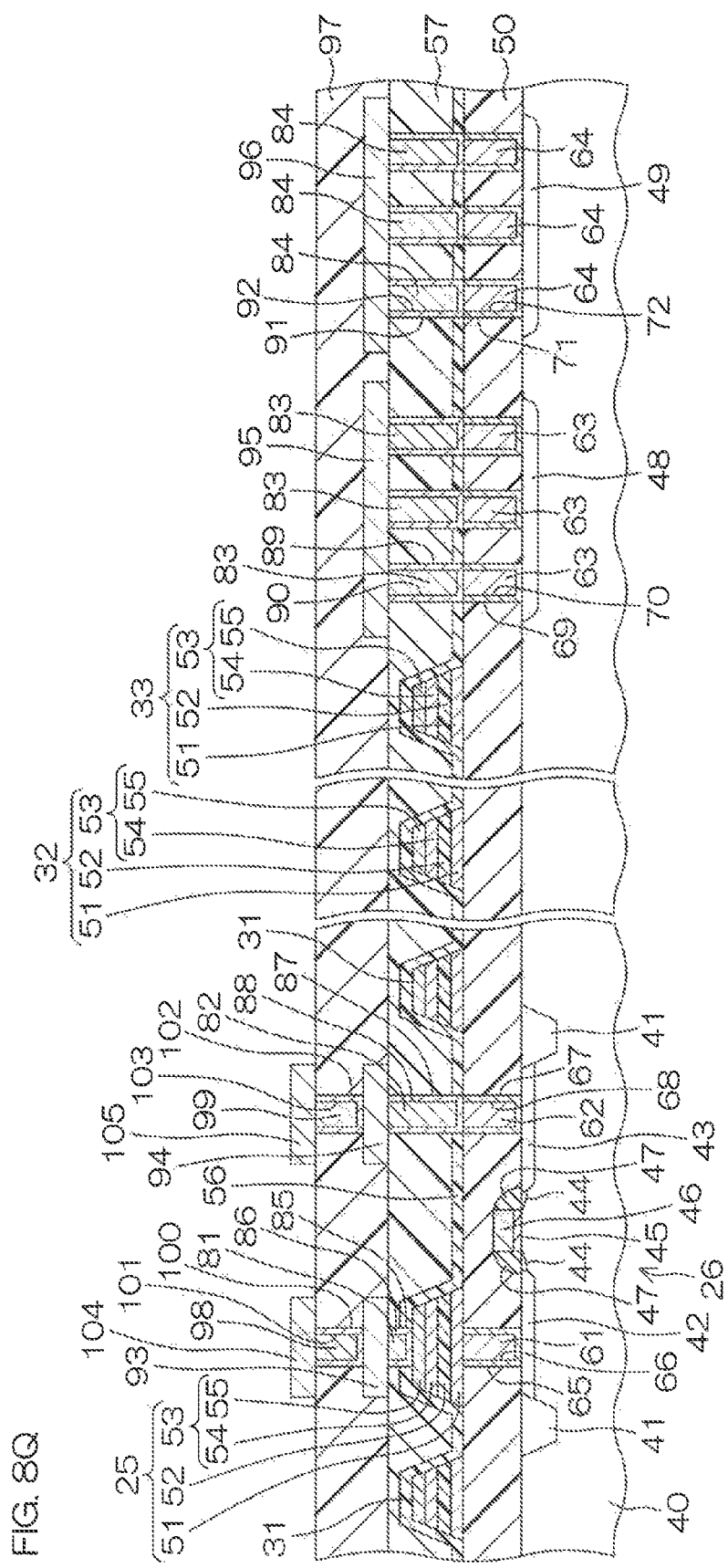
FIG. 8Q is a schematic sectional view of a step subsequent to that of FIG. 8P.

FIG. 8A to FIG. 8Q are sectional views for describing an example of a process for mainly manufacturing a nonvolatile logic cell, dummy capacitors formed in a periphery of the nonvolatile logic cell, and a guard ring and are sectional views corresponding to FIG. 6. FIG. 9A to FIG. 9M are sectional views for describing an example of a process for mainly manufacturing dummy capacitors, formed in a scribe region and a gap region, and the guard ring and are sectional views corresponding to FIG. 7.

As shown in FIG. 8A and FIG. 9A, the MOSFETs 26, the p type diffusion region 48, the n type diffusion region 49, and the functional elements (not shown) that constitute the volatile storage portions (flip-flops) 23 are formed by a known method in the semiconductor substrate 40. Each MOSFET 26 includes the corresponding element isolating region 41, drain region 42, source region 43, n type high resistance region 44, gate insulating film 45, gate electrode 46, and side wall 47. Thereafter, the first interlayer insulating film 50 is formed above the semiconductor substrate 40. The first to fourth contact holes 65, 67, 69, and 71, the barrier metals 66, 68, 70, and 72, and the first to fourth contact plugs 61 to 64 are then formed in the first interlayer insulating film 50.

Figure 9B:
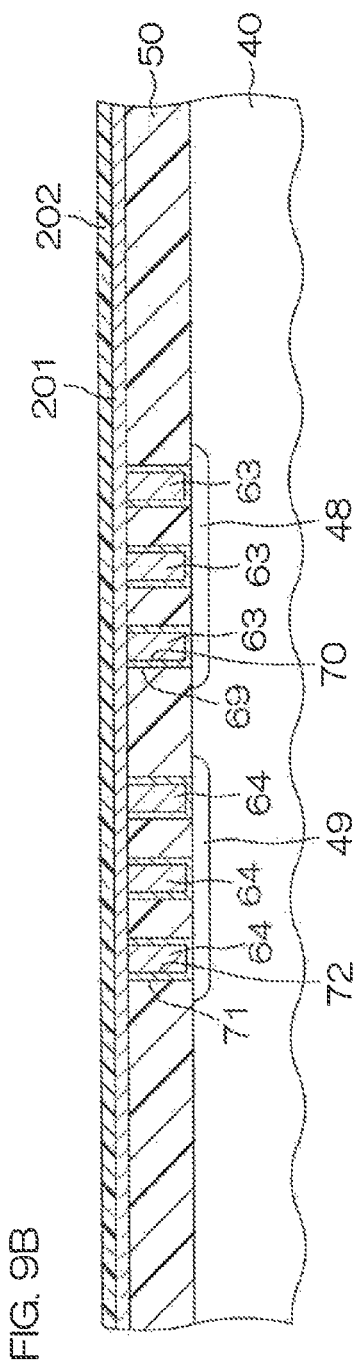
FIG. 9B is a schematic sectional view of a step subsequent to that of FIG. 9A.

Thereafter, as shown in FIG. 8B and FIG. 9B, a lower electrode material film 201, constituted of the material of the lower electrodes 51 of the ferroelectric capacitors 25 and the dummy capacitors 31 to 34, is formed above the first interlayer insulating film 50 by a sputtering method. Further, a PZT film 202, constituted of PZT, which is the material of the ferroelectric films 52, is formed above the lower electrode material film 201 by a MOCVD method.

Figure 9C:
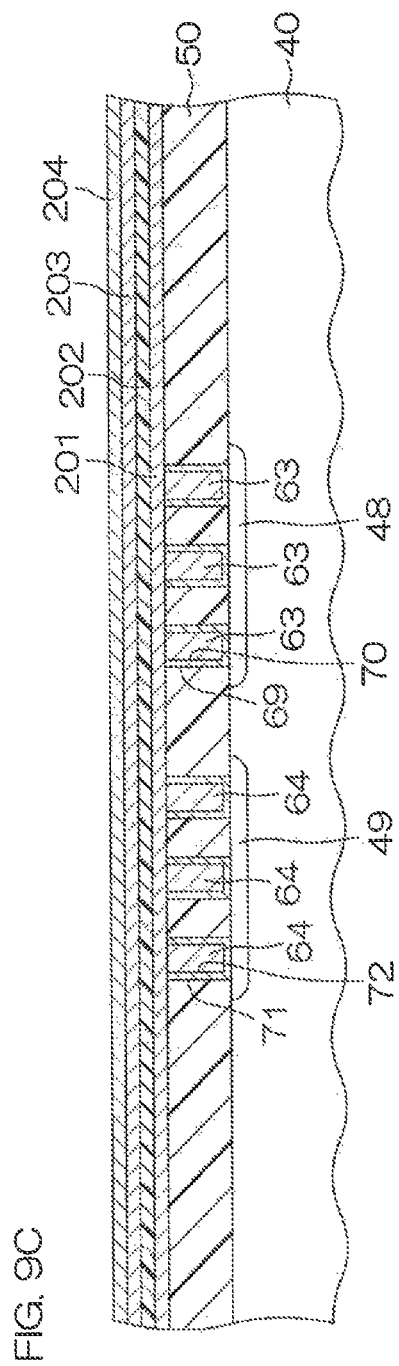
FIG. 9C is a schematic sectional view of a step subsequent to that of FIG. 9B.

Next, as shown in FIG. 8C and FIG. 9C, a laminated film 203 ($IrO_2$ film, Ir film, $IrO_2$ film, and Ir film), constituted of the material of the electrode lower layers 54 of the upper electrodes 53, is formed above the PZT film 202 by the sputtering method. Subsequently, a TiN film 204, constituted of TiN, which is the material of the electrode upper layers 55 of the upper electrodes 53, is formed above the laminated film 203 by the sputtering method. After forming the TiN film 204, a front surface of the TiN film 204 may be flattened, for example, by a CMP method.

Figure 9D:
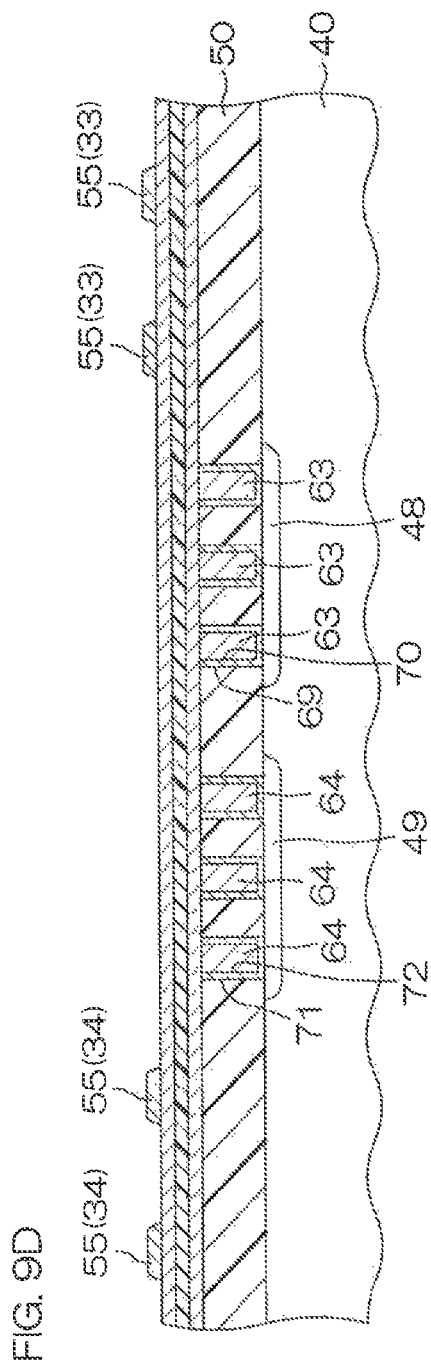
FIG. 9D is a schematic sectional view of a step subsequent to that of FIG. 9C.

Thereafter, as shown in FIG. 8D and FIG. 9D, a resist mask with a pattern of the electrode upper layers 55 is formed by photolithography and the electrode upper layers 55 of a predetermined pattern are formed by etching the TiN film 204 using the resist mask as a mask.

By then etching using the electrode upper layers 55 as masks, portions of the laminated film 203, the PZT film 202, and the lower electrode material film 201 that are exposed from the electrode upper layers 55 are removed successively. In this process, the laminated film 203, the PZT film 202, and the lower electrode material film 201 are etched continuously by switching a reaction gas (etchant) at appropriate timings. Consequently, as shown in FIG. 8E and FIG. 9E, the lower electrode material film 201, the PZT film 202, and the laminated film 203 are patterned to the lower electrodes 51, the ferroelectric films 52, and the electrode lower layers 54, respectively, and the ferroelectric capacitors 25 and the first to fourth dummy capacitors 31 to 34, each constituted of the corresponding lower electrode 51, ferroelectric film 52, electrode lower layer 54, and the electrode upper layer 55 are obtained.

Figure 9F:
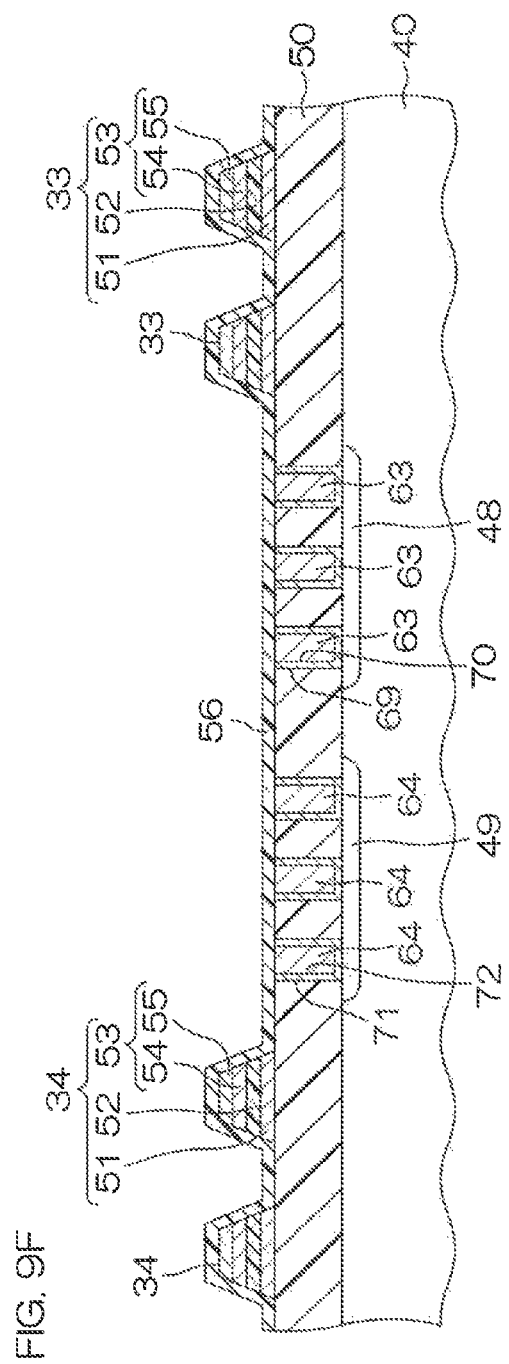
FIG. 9F is a schematic sectional view of a step subsequent to that of FIG. 9E.

Thereafter, as shown in FIG. 8F and FIG. 9F, the hydrogen barrier film 56 is formed above the first interlayer insulating film 50, the ferroelectric capacitors 25, and the dummy capacitors 31 to 34 by the sputtering method.

Next, as shown in FIG. 8G and FIG. 9G, the second interlayer insulating film 57 is formed above the hydrogen barrier film 56 by a CVD method. The front surfaces of the ferroelectric capacitors 25 and the dummy capacitors 31 to 34 are covered by the hydrogen barrier film 56 and therefore even if a CVD method using hydrogen is adopted as the method for forming the second interlayer insulating film 57, hydrogen reduction of the ferroelectric films 52 can be prevented.

Figure 9H:
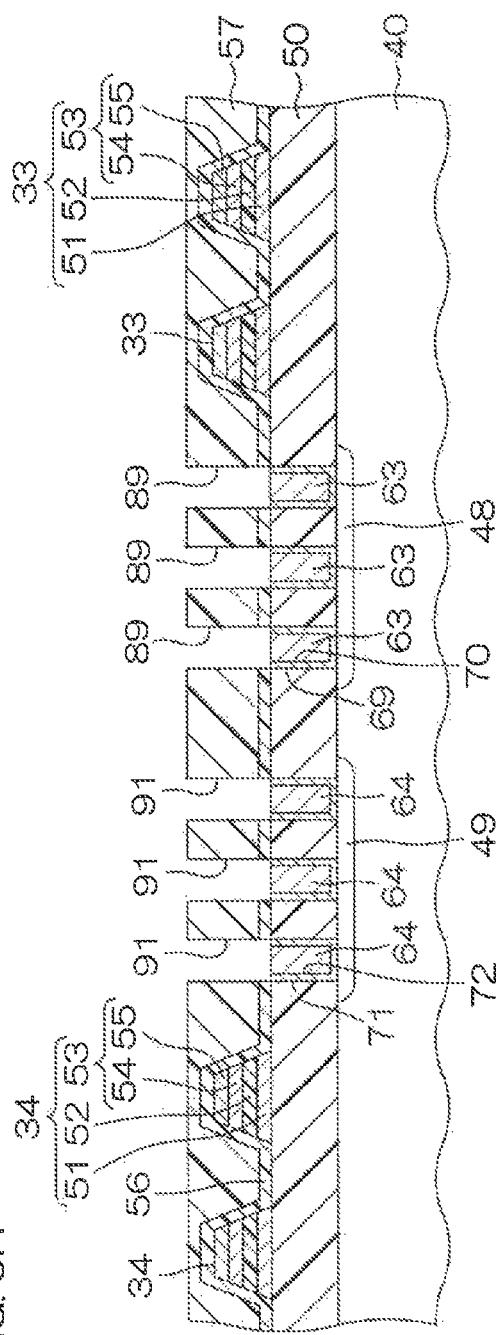
FIG. 9H is a schematic sectional view of a step subsequent to that of FIG. 9G.
Figure 91:
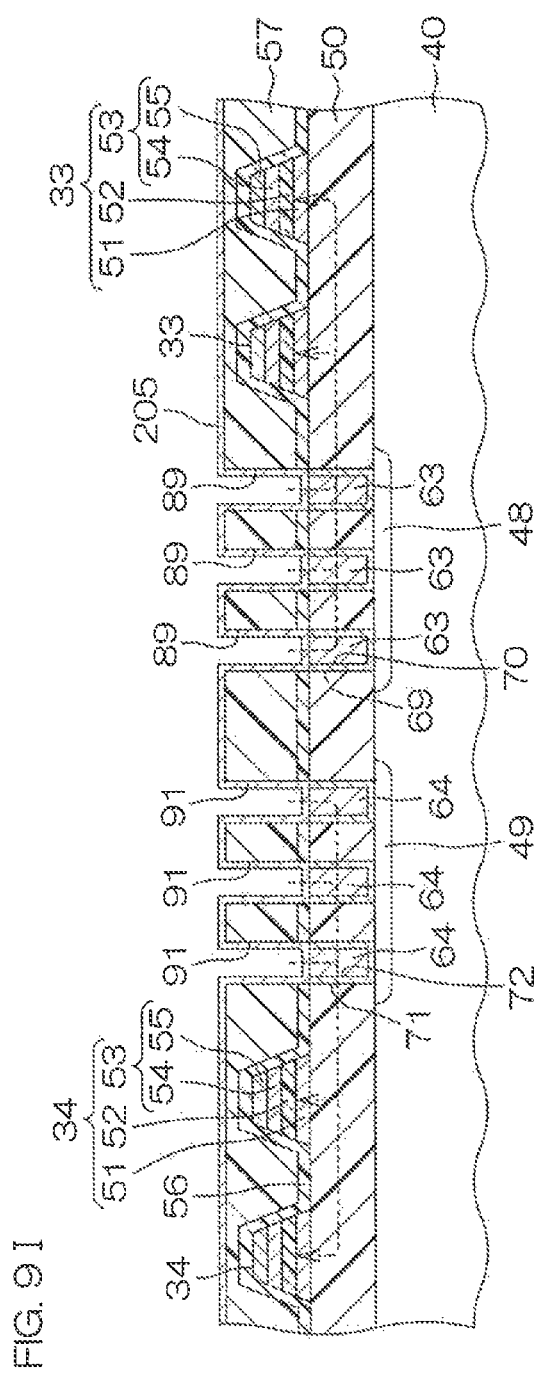

Next, as shown in FIG. 8H and FIG. 9H, the first via holes 85, the second via holes 87, the third via holes 89, and the fourth via holes 91 are formed in the second interlayer insulating film 57 by photolithography and etching.

Thereafter, as shown in FIG. 8I and FIG. 9I, a barrier metal material film 205, constituted of the material of the barrier metals 86, 88, 90, and 92, is formed above the second interlayer insulating film 57 by the sputtering method. The barrier metal material film 205 is also formed on inner surfaces (side surfaces and bottom surfaces) of the first via holes 85, the second via holes 87, the third via holes 89, and the fourth via holes 91. After forming the barrier metal material film 205, modification processing using hydrogen is performed on the barrier metal material film 205 to improve a barrier property of the barrier metal material film 205.

Hydrogen (hydrogen plasma) is used in the modification processing. As indicated by broken lines in FIG. 8I and FIG. 9I, the hydrogen used in the modification processing passes through the first to fourth via holes 85, 87, 89, and 91 and the first interlayer insulating film 50 and is absorbed by the ferroelectric films 52 inside the dummy capacitors 31 to 34. An amount of hydrogen intruding into the ferroelectric films 52 inside the ferroelectric capacitors 25 through the first to fourth via holes 85, 87, 89, and 91 and the first interlayer insulating film 50 can thus be reduced. Characteristics degradation of the ferroelectric capacitors 25 can thereby be suppressed.

In the present preferred embodiment, the dummy capacitors 32 and 33 are also provided in the peripheries of the nonvolatile logic cells 21 inside the nonvolatile logic region 13 in plan view and therefore a larger amount of hydrogen can be absorbed by the dummy capacitors in comparison to a case where the dummy capacitors are provided just inside the nonvolatile logic region 13 in plan view. Characteristics degradation of the ferroelectric capacitors 25 can thereby be suppressed effectively.

Also, in the present preferred embodiment, the dummy capacitors 34 are also provided in the scribe region 3 and therefore an even larger amount of hydrogen can be absorbed by the dummy capacitors. Characteristics degradation of the ferroelectric capacitors 25 can thereby be suppressed more effectively.

In particular, a large number of via holes 89 and 91 are formed in the guard ring 13B that has the ground line 35 and the power supply line 36 and therefore a large amount of hydrogen passes through the via holes 89 and 91 and intrudes inside the first interlayer insulating film 50 during the modification processing of the barrier metal material film 205 on the inner surfaces of the via holes 89 and 91. In the present preferred embodiment, a large number of dummy capacitors 33 are also formed in the gap region 13C at the inner side of the guard ring 13B. The hydrogen that has intruded inside the first interlayer insulating film 50 through the via holes 89 and 91 can thus be absorbed efficiently by the dummy capacitors 33. Characteristics degradation of the ferroelectric capacitors 25 can thereby be suppressed more effectively.

Figure 9J:
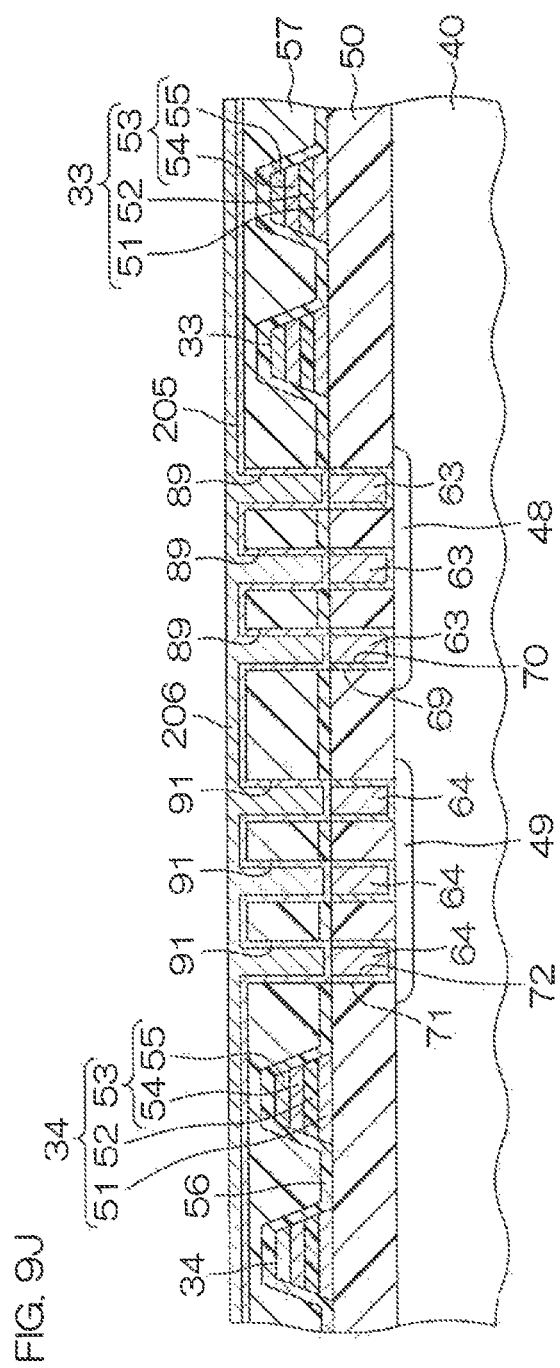
FIG. 9J is a schematic sectional view of a step subsequent to that of FIG. 9I.
Figure 9K:
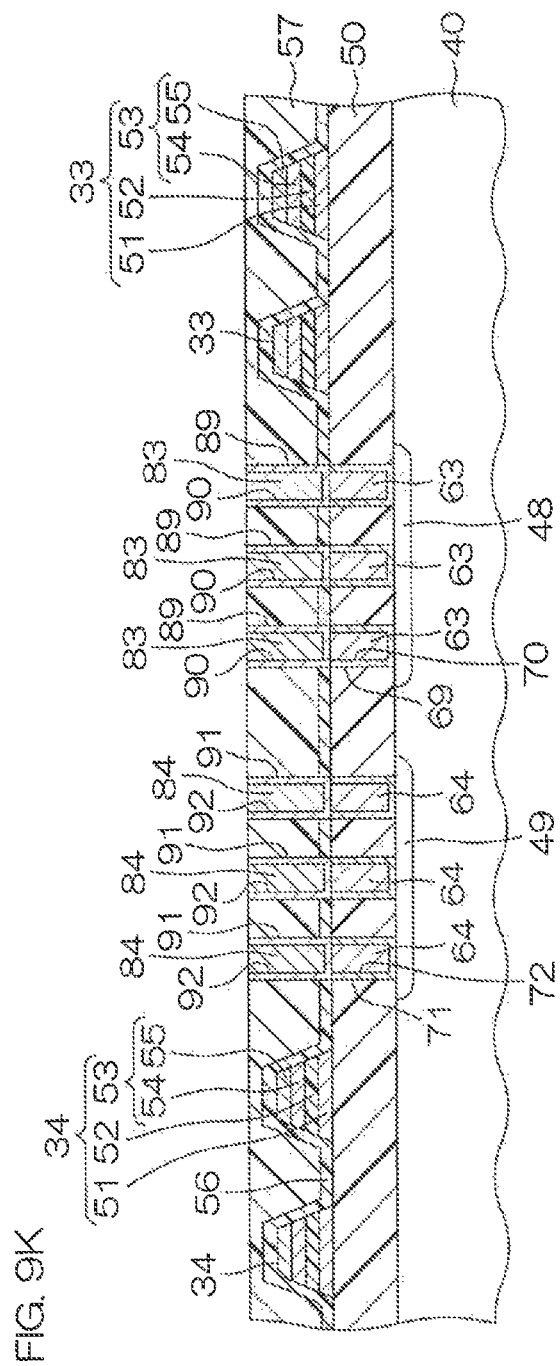
FIG. 9K is a schematic sectional view of a step subsequent to that of FIG. 9J.

When the modification processing of the barrier metal material film 205 is completed, a deposited layer 206, constituted of the material of the first to fourth via plugs 81 to 84, is laminated above the barrier metal material film 205 by the CVD method as shown in FIG. 8J and FIG. 9J. The deposited layer 206 and the barrier metal material film 205 are then polished by the CMP method. The polishing is continued until unnecessary portions of the barrier metal material film 205 and the deposited layer 206 that are formed at an exterior of the first to fourth via plugs 81 to 84 are removed and a front surface of the deposited layer 206 remaining in an interior of each of the first to fourth via plugs 81 to 84 becomes flush with a front surface (upper surface) of the second interlayer insulating film 57. Consequently, as shown in FIG. 8K and FIG. 9K, the first via plugs 81 embedded in the first via holes 85 with the barrier metals 86 interposed therebetween and the second via plugs 82 embedded in the second via holes 87 with the barrier metals 88 interposed therebetween are formed. Also, the third via plugs 83 embedded in the third via holes 89 with the barrier metals 90 interposed therebetween and the fourth via plugs 84 embedded in the fourth via holes 91 with the barrier metals 92 interposed therebetween are formed.

Figure 9L:
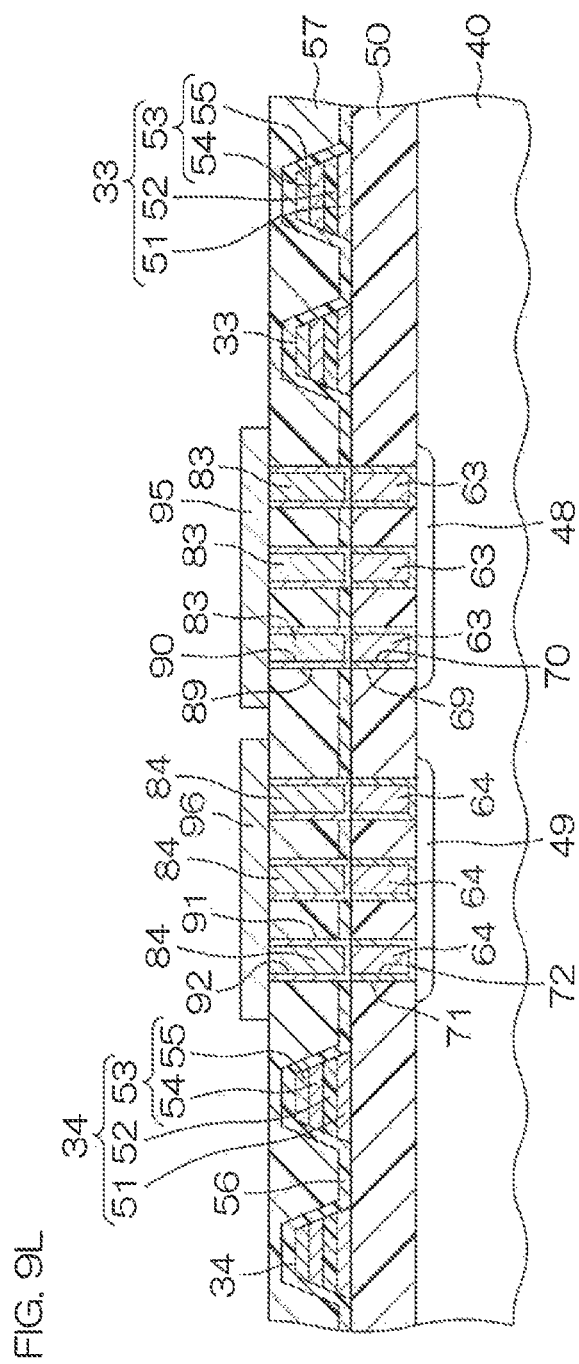
FIG. 9L is a schematic sectional view of a step subsequent to that of FIG. 9K.

Next, as shown in FIG. 8L and FIG. 9L, a wiring film, constituted of a conductive material, is formed above the second interlayer insulating film 57. The wiring film is constituted, for example, of a laminated film of a titanium layer, an aluminum layer, and a titanium layer. Thereafter, by patterning of the wiring film by photolithography and etching, the wirings, such as the first wirings 93, the second wirings 94, the ground line 95, the power supply line 96, etc., are formed at the same time.

Figure 9M:
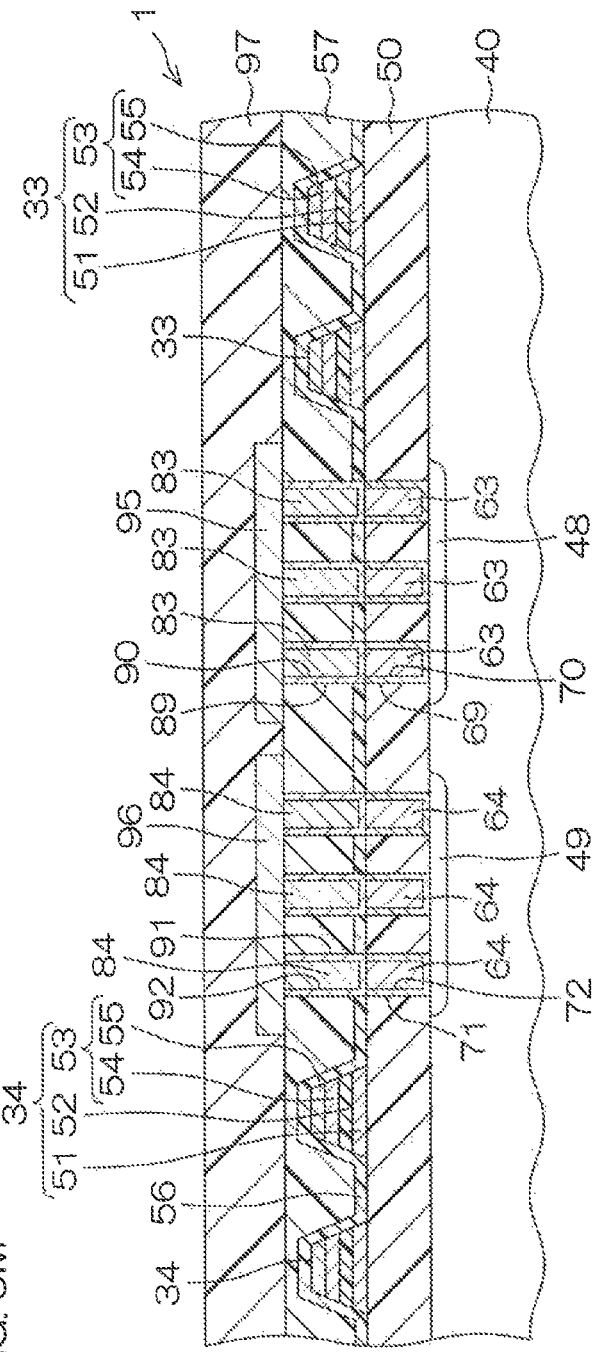
FIG. 9M is a schematic sectional view of a step subsequent to that of FIG. 9L.

Next, as shown in FIG. 8M and FIG. 9M, the third interlayer insulating film 97 is formed above the second interlayer insulating film 57 and above the first wirings 93, the second wirings 94, the ground line 95, and the power supply line 96 by the CVD method.

Next, as shown in FIG. 8N, the fifth via holes 100 and the sixth via holes 102 are formed in the third interlayer insulating film 97 by photolithography and etching.

Thereafter, as shown in FIG. 8O, a barrier metal material film 207, constituted of the material of the barrier metals 101 and 103, is formed above the third interlayer insulating film 97 by the sputtering method. The barrier metal material film 207 is also formed on inner surfaces (side surfaces and bottom surfaces) of the fifth via holes 100 and the sixth via holes 102. After forming the barrier metal material film 207, modification processing using hydrogen is performed on the barrier metal material film 207 to improve a barrier property of the barrier metal material film 207.

Hydrogen (hydrogen plasma) is used in the present modification processing as well. The hydrogen used in the modification processing passes through the fifth via holes 100, the sixth via holes 102, the third interlayer insulating film 97, and the second interlayer insulating film 57 and is absorbed by the ferroelectric films 52 inside the dummy capacitors 31 to 34. The amount of hydrogen intruding into the ferroelectric films 52 inside the ferroelectric capacitors 25 can thus be reduced. Characteristics degradation of the ferroelectric capacitors 25 can thereby be suppressed.

When the modification processing of the barrier metal material film 207 is completed, a deposited layer, constituted of the material of the fifth via plugs 98 and the sixth via plugs 99, is laminated above the barrier metal material film 207 by the CVD method. The deposited layer and the barrier metal material film 207 are then polished by the CMP method. The polishing is continued until unnecessary portions of the barrier metal material film 207 and the deposited layer that are formed at an exterior of the fifth via plugs 98 and the sixth via plugs 99 are removed and a front surface of the deposited layer remaining in an interior of each of the fifth via plugs 98 and the sixth via plugs 99 becomes flush with a front surface (upper surface) of the third interlayer insulating film 97. Consequently, as shown in FIG. 8P, the fifth via plugs 98 embedded in the fifth via holes 100 with the barrier metals 101 interposed therebetween and the sixth via plugs 99 embedded in the sixth via holes 102 with the barrier metals 103 interposed therebetween are formed.

Next, as shown in FIG. 8Q, a wiring film, constituted of a conductive material, is formed above the third interlayer insulating film 97. The wiring film is constituted, for example, of a laminated film of a titanium layer, an aluminum layer, and a titanium layer. Thereafter, by patterning of the wiring film by photolithography and etching, the wirings, such as the third wirings 104, the fourth wirings 105, etc., are formed at the same time. The nonvolatile logics, the guard ring 13B, the dummy capacitors 31 to 34, etc., are thereby manufactured.

When the semiconductor wafer 1, such as shown in FIG. 1, is manufactured through the process, etc., described above, the scribe region 3 of the semiconductor wafer 1 is cut by a dicing blade and the individual semiconductor device 4, each including the functional element region 2, are thereby cut out. Each individual semiconductor device 4 that has thus been cut out has the scribe region 3 at its peripheral edge portion and has the functional element region 2 in a central region 3 surrounded by the scribe region 3. In the preferred embodiment described above, the fourth dummy capacitors 34 are formed in the entirety of the scribe region 3 and therefore the fourth dummy capacitors 34 formed in the scribe region 3 remain in the peripheral edge portion of the semiconductor device 4.

In the preferred embodiment described above, hydrogen (hydrogen plasma) is used in the process of manufacturing the semiconductor device 4, especially in the modification processing after the film formation of the barrier metals 66, 68, 70, and 72 on the interiors of the via holes (mainly the first to fourth via holes 85, 87, 89, and 91). In particular, the guard ring 13B includes the ground line 35 and the power supply line 36 and therefore includes a large number of via holes 89 and 91. A large amount of hydrogen thus passes through the via holes 89 and 91 and intrude inside the first interlayer insulating film 50 during the modification processing of the barrier metal material film on the inner surfaces of the via holes 89 and 91.

In the preferred embodiment described above, the plurality of second and third dummy capacitors 32 and 33 are provided in the peripheries of the nonvolatile logic cells 21 inside the nonvolatile logic region 13 as well. The hydrogen used in the modification processing after the film formation of the barrier metals 66, 68, 70, and 72 on the interiors of the via holes 85, 87, 89, and 91 can thereby be made to be absorbed by the second and third dummy capacitors 32 and 33. Hydrogen reduction of the ferroelectric films 52 inside the ferroelectric capacitors 25 can thereby be suppressed and characteristics degradation of the ferroelectric capacitors 25 can thus be suppressed.

Also, with the present preferred embodiment, the plurality of third dummy capacitors 33 are formed in the gap region 13C at the inner side of the guard ring 13B. The hydrogen that has intruded inside the first interlayer insulating film 50 through the via holes 89 and 91 during the modification processing of the barrier metal material film on the inner surfaces of the via holes 89 and 91 of the guard ring 13B can thus be absorbed efficiently by the dummy capacitors 33. Characteristics degradation of the ferroelectric capacitors 25 can thereby be suppressed more effectively.

Also, with the present preferred embodiment, the plurality of fourth dummy capacitors 34 are provided in the scribe region 3 as well and therefore an even larger amount of hydrogen can be absorbed by the fourth dummy capacitors 34. Characteristics degradation of the ferroelectric capacitors 25 can thereby be suppressed more effectively.

Although a preferred embodiment of the present invention has been described above, the present invention may be implemented in yet other embodiments. Although in the preferred embodiment described above, the third dummy capacitors 33, formed in the gap region 13C, are formed in a lattice in plan view, the third dummy capacitors 33 may be formed in a staggered form in plan view as shown in FIG. 10. Also, although in the preferred embodiment described above, the fourth dummy capacitors 34, formed in the scribe region 3, are formed in a lattice in plan view, the fourth dummy capacitors 34 may be formed in a staggered form in plan view as shown in FIG. 10. FIG. 10 is a plan view corresponding to FIG. 5.

Also, although in the preferred embodiment described above, the first dummy capacitors 31 are formed in the interiors of the nonvolatile logic cells 21 in plan view, the first dummy capacitors 31 do not need to be formed.

Also, although in the preferred embodiment described above, the fourth dummy capacitors 34 are formed in the scribe region 3, the fourth dummy capacitors 34 do not need to be formed.

Although with the preferred embodiment described above, a case where the present invention is applied to a semiconductor device having a nonvolatile logic was described, the present invention may also be applied to a semiconductor device having a ferroelectric memory (Fe-RAM). The ferroelectric memory includes a plurality of memory cells. Each memory cell is constituted of a field effect transistor and a ferroelectric capacitor as disclosed, for example, in Japanese Patent Application Publication No. 2014-103426. In this case, the memory cell of the ferroelectric memory is an example of the nonvolatile storage element of the present invention.

When the present invention is applied to a semiconductor device having a ferroelectric memory, the nonvolatile logic region 13 in the preferred embodiment described above may be replaced by a ferroelectric memory region and the core region 13A in the preferred embodiment described above may be replaced by a core region in which a plurality of ferroelectric memory cells are formed. In this case, the same guard ring 13B and gap region 13C as in the preferred embodiment described above may be provided in the ferroelectric memory region.

The present application corresponds to Japanese Patent Application No. 2015-247771 filed on Dec. 18, 2015 in the Japan Patent Office, and the entire disclosure of this application is incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A semiconductor device, comprising:
a core region, in which a plurality of nonvolatile storage elements are formed, each nonvolatile storage element including a ferroelectric capacitor and a transistor electrically connected to the ferroelectric capacitor; and
a plurality of ferroelectric dummy capacitors formed in a periphery of the plurality of nonvolatile storage elements, each of the plurality of ferroelectric dummy capacitors being electrically isolated,
a plurality of first ferroelectric dummy capacitors formed inside each nonvolatile storage element, each of the plurality of first ferroelectric dummy capacitors being electrically isolated,
a guard ring, disposed so as to surround the core region in a plan view and including a plurality of via plugs;
a gap region between the core region and the guard ring; and
a scribe region disposed outside the guard ring in the plan view, wherein
the plurality of ferroelectric dummy capacitors formed in the periphery of the plurality of nonvolatile storage elements include a plurality of second ferroelectric dummy capacitors that are disposed, in the plan view, inside the core region between the gap region and the plurality of nonvolatile storage elements formed in the core region, a plurality of third ferroelectric dummy capacitors formed inside the gap region and a plurality of fourth ferroelectric dummy capacitors formed inside the scribe region in the plan view, and
the plurality of second ferroelectric dummy capacitors include a plurality of second ferroelectric dummy capacitors disposed between two adjacent nonvolatile memory elements,
the semiconductor device further comprising
a semiconductor substrate,
a first interlayer insulating film formed above the semiconductor substrate and on which the ferroelectric capacitor and the first to fourth ferroelectric dummy capacitors are formed,
a hydrogen barrier film, covering front surfaces of the ferroelectric capacitor, the first to fourth ferroelectric dummy capacitors, and the first interlayer insulating film, and
a second interlayer insulating film, formed above the hydrogen barrier film,
wherein the guard ring includes
a ground line and a power supply line of annular shapes in the plan view that are formed above the second interlayer insulating film,
a plurality of first grounding plugs embedded in the second interlayer insulating film and electrically connected to the ground line,
a plurality of second grounding plugs embedded in the first interlayer insulating film and electrically connected to each of the first grounding plugs,
a plurality of first power supply plugs embedded in the second interlayer insulating film and electrically connected to the power supply line, and
a plurality of second power supply plugs embedded in the first interlayer insulating film and electrically connected to each of the first power supply plugs,
wherein
the plurality of first grounding plugs include a plurality of grounding plugs arranged at intervals in a direction orthogonal to a thickness direction of the second interlayer insulating film,
the plurality of second grounding plugs include a plurality of grounding plugs arranged at intervals in a direction orthogonal to a thickness direction of the first interlayer insulating film,
the plurality of first power plugs include a plurality of power plugs arranged at intervals in a direction orthogonal to the thickness direction of the second interlayer insulating film, the plurality of second power plugs include a plurality of ground plugs arranged at intervals in a direction perpendicular to the thickness direction of the first interlayer insulating film, and an arrangement interval of the plurality of second ferroelectric dummy capacitors is larger than an arrangement interval of the plurality of third ferroelectric dummy capacitors and an arrangement interval of the plurality of fourth ferroelectric dummy capacitors.

2. The semiconductor device according to claim 1, wherein each of the first grounding plugs is embedded inside a grounding hole, formed in the second interlayer insulating film, with a barrier metal, formed on an inner surface of the grounding hole, interposed therebetween, each of the second grounding plugs is embedded inside a grounding hole, formed in the first interlayer insulating film, with a barrier metal, formed on an inner surface of the second grounding hole, interposed therebetween, each of the first power supply plugs is embedded inside a power supply hole, formed in the second interlayer insulating film, with a barrier metal, formed on an inner surface of the power supply hole, interposed therebetween, and each of the second power supply plugs is embedded inside a power supply hole, formed in the first interlayer insulating film, with a barrier metal, formed on an inner surface of the power supply hole, interposed therebetween.

3. The semiconductor device according to claim 1, wherein the nonvolatile storage element is a nonvolatile logic cell including a volatile storage portion and a nonvolatile storage portion having the ferroelectric capacitor and arranged to hold data of the volatile storage portion.

* * * * *